United States Patent
Hayashi et al.

(10) Patent No.: US 9,620,712 B2
(45) Date of Patent: Apr. 11, 2017

(54) CONCAVE WORD LINE AND CONVEX INTERLAYER DIELECTRIC FOR PROTECTING A READ/WRITE LAYER

(71) Applicant: SANDISK 3D LLC, Milipitas, CA (US)

(72) Inventors: Eiji Hayashi, Nagoya (JP); Naohito Yanagida, Yokkaichi (JP); Michiaki Sano, Ichinomiya (JP); Akira Nakada, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 335 days.

(21) Appl. No.: 14/529,731

(22) Filed: Oct. 31, 2014

(65) Prior Publication Data

US 2016/0126455 A1    May 5, 2016

(51) Int. Cl.
*H01L 45/00* (2006.01)
*H01L 27/24* (2006.01)

(52) U.S. Cl.
CPC ............ *H01L 45/16* (2013.01); *H01L 27/249* (2013.01); *H01L 45/04* (2013.01); *H01L 45/1226* (2013.01); *H01L 45/1273* (2013.01); *H01L 45/1616* (2013.01); *H01L 45/06* (2013.01); *H01L 45/141* (2013.01); *H01L 45/145* (2013.01)

(58) Field of Classification Search
CPC ..... H01L 45/04; H01L 45/06; H01L 45/1226; H01L 45/1273; H01L 45/141; H01L 45/145; H01L 45/16; H01L 45/1616; H01L 27/249
USPC .. 257/E27.075, E27.084, E27.098, E27.104, 257/E21.646, E21.661, E21.662, E21.663, 257/E21.665, E21.6, 298, 324
See application file for complete search history.

(56) References Cited

U.S. PATENT DOCUMENTS 5,915,167 A    6/1999  Leedy
7,983,065 B2   7/2011  Samachisa
(Continued)

FOREIGN PATENT DOCUMENTS

WO    WO2007/004843 A1    1/2007

OTHER PUBLICATIONS

U.S. Appl. No. 14/529,624, filed Oct. 31, 2014, SanDisk 3D LLC.
U.S. Appl. No. 14/529,624, Office Action issued Mar. 10, 2016, 20pgs.

*Primary Examiner* — Hoai-An D Nguyen
(74) *Attorney, Agent, or Firm* — The Marbury Law Group PLLC

(57) ABSTRACT

An alternating stack of electrically conductive layers and electrically insulating layers is formed over global bit lines formed on a substrate. The alternating stack is patterned to form a line stack of electrically conductive lines and electrically insulating lines. Trench isolation structures are formed within each trench to define a plurality of memory openings laterally spaced from one another by the line stack in one direction and by trench isolation structures in another direction. The electrically conductive lines are laterally recessed relative to sidewall surfaces of the electrically insulating lines. A read/write memory material is deposited in recesses, and is anisotropically etched so that a top surface of a global bit line is physically exposed at a bottom of each memory opening. An electrically conductive bit line is formed within each memory opening to form a resistive random access memory device.

35 Claims, 25 Drawing Sheets

(56) References Cited

U.S. PATENT DOCUMENTS

| | | |
|---|---|---|
| 8,283,228 B2 | 10/2012 | Alsmeier |
| 8,349,681 B2 | 1/2013 | Alsmeier et al. |
| 2008/0099828 A1* | 5/2008 | Heinrichsdorff ...... H01L 27/115 257/324 |
| 2009/0001437 A1* | 1/2009 | Won .................. H01L 21/31144 257/300 |
| 2010/0200906 A1* | 8/2010 | Kidoh ............... H01L 27/11578 257/324 |
| 2012/0147648 A1 | 6/2012 | Scheuerlein |
| 2013/0043455 A1 | 2/2013 | Bateman |
| 2013/0056820 A1 | 3/2013 | Jeong |
| 2013/0248801 A1 | 9/2013 | Yamamoto |
| 2014/0138597 A1 | 5/2014 | Nojiri et al. |
| 2014/0273373 A1 | 9/2014 | Makala et al. |
| 2014/0326939 A1 | 11/2014 | Yamato et al. |
| 2014/0374688 A1* | 12/2014 | Wu .................... H01L 27/2445 257/4 |
| 2016/0104719 A1* | 4/2016 | Jung ................ H01L 27/11582 257/324 |

* cited by examiner

CONCAVE WORD LINE AND CONVEX INTERLAYER DIELECTRIC FOR PROTECTING A READ/WRITE LAYER

RELATED APPLICATIONS

The present application is related to a copending application, the entire contents of which are incorporated herein by reference.

FIELD

The present disclosure relates generally to the field of semiconductor devices and specifically to three-dimensional non-volatile memory devices, such as a three-dimensional resistive random access memory (ReRAM) devices and other three-dimensional devices, and methods of making the same.

BACKGROUND

Demand for greater computing capabilities especially in mobile computing has created a need for developing new technology for non-volatile memory devices having large memory capacity, high density, and low power consumption. Flash memory devices, while being the most common type of non-volatile memory devices, requires relatively high operational voltage to write or erase data. As the gate length a conventional flash memory device scales down to tens of nanometers, adjacent memory cells may be parasitically operated during operation of a single memory cell, thus corrupting the integrity of data stored in memory cells. Such parasitic coupling between adjacent memory cells poses a serious challenge to further scaling of conventional flash memory devices.

Resistance Random Access Memory, or "ReRAM," is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths. Application of a different type of electrical voltage bias can cause reversal of the resistance of the thin film to an original high-resistance state by removal of the filaments from the thin film. Thus, data can be stored in a ReRAM cell by changing the resistance of the thin film, which can be a solid-state material. The thin film is referred to as a memristor, a memory film, or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a memory device is provided, which includes a substrate having a major surface, a first stack comprising an alternating plurality of electrically conductive lines elongated in a first direction substantially parallel to the major surface of the substrate and electrically insulating lines elongated in the first direction. Each of the plurality of electrically conductive lines is recessed in a second direction below an adjacent electrically insulating line to form a first plurality of recesses. The second direction is substantially perpendicular to the first direction and is substantially parallel to the major surface of the substrate. Each recess of the first plurality of recesses is formed adjacent to a respective one of the plurality of electrically conductive lines and overhung by a respective one of the plurality of electrically insulating lines in the first stack. A read/write memory material at least partially fills each of the first plurality of recesses. An electrically conductive bit line is elongated in a third direction substantially perpendicular to the major surface of the substrate. The electrically conductive bit line is in electrical contact with the read/write memory material.

Referring to another aspect of the present disclosure, a method of forming a memory device is provided. A first stack is formed over a major surface of a substrate. The first stack comprises an alternating plurality of electrically conductive lines elongated in a first direction substantially parallel to the major surface of the substrate and electrically insulating lines elongated in the first direction. The plurality of electrically conductive lines is selectively etched to form a first plurality of recesses in the first stack. Each recess of the first plurality of recesses is formed adjacent to a respective one of the plurality of electrically conductive lines and is overhung by a respective one of the plurality of electrically insulating lines in the first stack. Each of the plurality of electrically conductive lines is recessed in a second direction which is substantially perpendicular to the first direction and is substantially parallel to the major surface of the substrate. Each of the first plurality of recesses is at least partially filled with a read/write memory material. An electrically conductive bit line is formed, which is elongated in a third direction substantially perpendicular to the major surface of the substrate. The electrically conductive bit line is in electrical contact with the read/write memory material.

According to yet another embodiment of the present disclosure, a method of forming a memory device is provided. A stack of layers is provided, which includes alternating plurality of electrically conductive layers and electrically insulating lines. Each layer in the stack of layers extends in a first direction substantially parallel to a major surface of a substrate and in a second direction substantially parallel to the major surface of the substrate and transverse to the first dimension, and has a thickness in a third direction substantially perpendicular to the major surface of a substrate. The stack of layers is patterned to form at least one line stack. The at least one line stack comprises an alternating plurality of electrically conductive lines elongated in the first direction and electrically insulating lines elongated in the first direction, and a respective first plurality of protrusions on each electrically conductive line of the plurality of electrically conductive lines. Each protrusion of the first plurality of protrusions protrudes in the second direction from a first sidewall of the electrically conductive line to a distal tip of the protrusion.

According to still another embodiment of the present disclosure, a memory device is provided, which comprises a substrate having a major surface, a line stack comprising an alternating plurality of electrically conductive lines elongated in a first direction substantially parallel to the major surface of the substrate and electrically insulating lines elongated in the first direction, a first trench extending in the first direction along a first side of the line stack facing a second direction transverse the first direction, a read/write memory material at least partially filling the first trench, and a first plurality of electrically conductive bit lines elongated in a third direction substantially perpendicular to the major surface of the substrate. Each electrically conductive bit line is at least partially contained in the first trench, and each electrically conductive bit line is in electrical contact with the read/write memory material. The memory device further comprises a respective first plurality of protrusions on each electrically conductive line of line stack. Each protrusion of the respective first plurality of protrusions protrudes into the first trench from a first sidewall of the electrically conductive line to a distal tip in contact with the read/write memory material.

According to even another aspect of the present disclosure, a memory device is provided, which comprises a first electrically conductive line elongated in a first direction parallel to a major surface of a substrate and comprising a protrusion protruding from a side wall of the first electrically conductive line to a distal tip in a second direction parallel to the major surface of a substrate and transverse to the first direction, a second electrically conductive line elongated in a third direction perpendicular to the major surface of the substrate, and a read/write memory material disposed between and in electrical contact with the distal tip of the protrusion and the second electrically conductive line.

DETAILED DESCRIPTION

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Figure 1A:
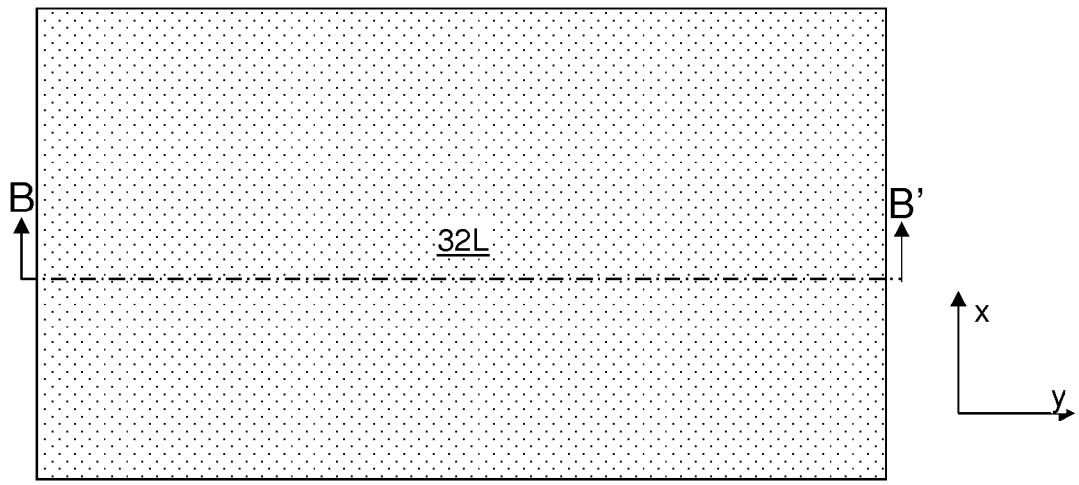
FIG. 1A is a top-down view of a first exemplary structure after formation of an alternating stack of electrically insulating lines and electrically conductive layers according to a first embodiment of the present disclosure.
Figure 1B:
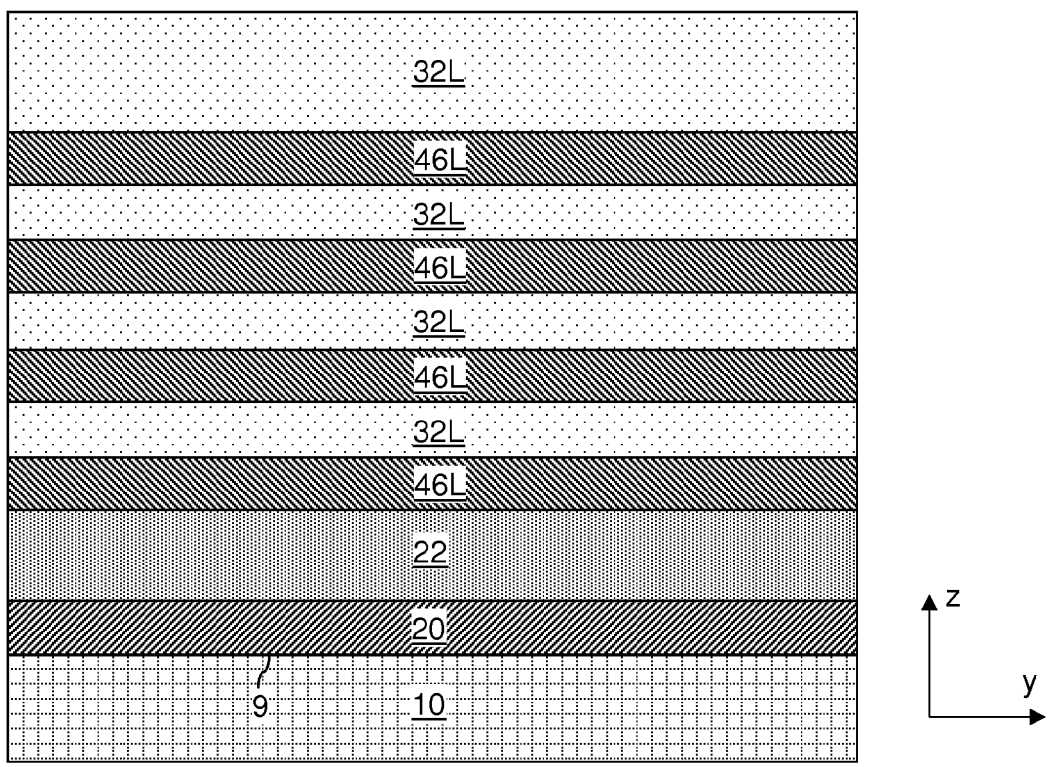
FIG. 1B is a vertical cross-sectional view of the first exemplary structure along the vertical plane B-B' of FIG. 1A.

The various three dimensional memory devices of the present disclosure can include a ReRAM device, and can be fabricated employing the various embodiments described herein. Referring to FIGS. 1A and 1B, a first exemplary structure according to a first embodiment of the present disclosure includes a substrate 10, which can include a semiconductor substrate. The substrate 10 can comprise an insulator such as a silicon oxide layer (not expressly shown) in an upper portion thereof. Further, the substrate 10 can comprise a silicon substrate, and can have thereon or therein at least one driver circuit for memory devices to be subsequently formed. A top surface of the substrate 10 can be a major surface 9. As used herein, a major surface is a surface of an element having a greater area than another surface of the element.

Electrically conductive patterned structures 20 can be formed on the substrate 10 to provide lateral electrical connection to devices to be subsequently formed on the substrate 10. In one embodiment, the electrically conductive patterned structures 20 can be electrically conductive lines that are laterally spaced from one another along a horizontal direction, which is herein referred to as a first direction (e.g., the x-direction), and laterally extend along a second horizontal direction, which is herein referred to as a second direction (e.g., the y-direction). In one embodiment, the electrically conductive patterned structures 20 can be at least one electrically conductive global bit line extending in the second direction. The electrically conductive patterned structures 20 includes a conductive material such as an elemental metal, in intermetallic alloy of at least two elemental metals, a doped semiconductor material, a metal semiconductor alloy such as a metal silicide, a conductive metal oxide, a conductive metal oxide, or a combination thereof. In one embodiment, the electrically conductive patterned structures 20 can include a metal nitride such as titanium nitride. The thickness of the electrically conductive patterned structures 20 can be in a range from 10 nm to 100 nm, although lesser and greater thicknesses can also be employed. The electrically conductive patterned structures 20 can be formed, for example, by deposition of a conductive material and subsequent patterning of the conductive material by lithographic patterning employing a photoresist layer and an etch process. The conductive material can be deposited, for example, by chemical vapor deposition, physical vapor deposition, atomic layer deposition, electroplating, electroless plating, or a combination thereof.

A dielectric material layer 22 can be formed on the top surface of the electrically conductive patterned structures 20 and over the substrate 10. The dielectric material layer 22 includes a dielectric material such as silicon nitride, silicon oxide, a dielectric metal oxide, or a combination thereof. The dielectric material layer 22 can be formed as a single contiguous layer of a dielectric material, for example, by chemical vapor deposition. The thickness of the dielectric material layer 22 can be in a range from 10 nm to 200 nm, although lesser and greater thicknesses can also be employed.

An alternating plurality of electrically conductive layers 46L and electrically insulating layers 32L can be formed over the substrate 10. The materials of the plurality of electrically conductive layers 46L and the plurality of electrically insulating layers 32L are selected such that, for at least one etch process, the plurality of electrically conductive layers comprises a material characterized by a higher etch rate than an etch rate of a material forming the plurality of electrically insulating layers 32L.

The electrically conductive layers 46L include a conductive material such as an elemental metal, in intermetallic alloy of at least two elemental metals, a doped semiconductor material, a metal semiconductor alloy such as a metal silicide, a conductive metal oxide, a conductive metal oxide, or a combination thereof. In one embodiment, the electrically conductive layers 46L can include a metal nitride such as titanium nitride. In one embodiment, the electrically conductive layers 46L include a metal nitride such as titanium nitride. The thickness of each electrically conductive layer 46L can be in a range from 10 nm to 50 nm, although lesser and greater thicknesses can also be employed. The electrically conductive layers 46L can be formed, for example, by deposition of a conductive material by a conformal or a non-conformal deposition method. The conductive material can be deposited, for example, by chemical vapor deposition, physical vapor deposition, atomic layer deposition, electroplating, electroless plating, or a combination thereof.

The electrically insulating layers 32L include an insulator material such as an insulating oxide, an insulating nitride, an insulating oxynitride, or a combination thereof. For example, the electrically insulating layers 32L can include silicon oxide (such as undoped silicate glass or doped silicate glass) or a dielectric metal oxide. In one embodiment, the electrically insulating layers 32L can include an insulating oxide. In one embodiment, the electrically insulating layers 32L include silicon oxide. The thickness of each electrically insulating layer 32L other than the topmost electrically insulating layer 32L may be in a range from 10 nm to 50 nm, although lesser and greater thicknesses can also be employed. The topmost electrically insulating layer 32L may have a thickness in a range from 20 nm to 200 nm, although lesser and greater thicknesses can also be employed. The electrically insulating layers 32L can be formed, for example, by deposition of an insulating material by a conformal or a non-conformal deposition method. The insulating material can be deposited, for example, by chemical vapor deposition.

Figure 2A:
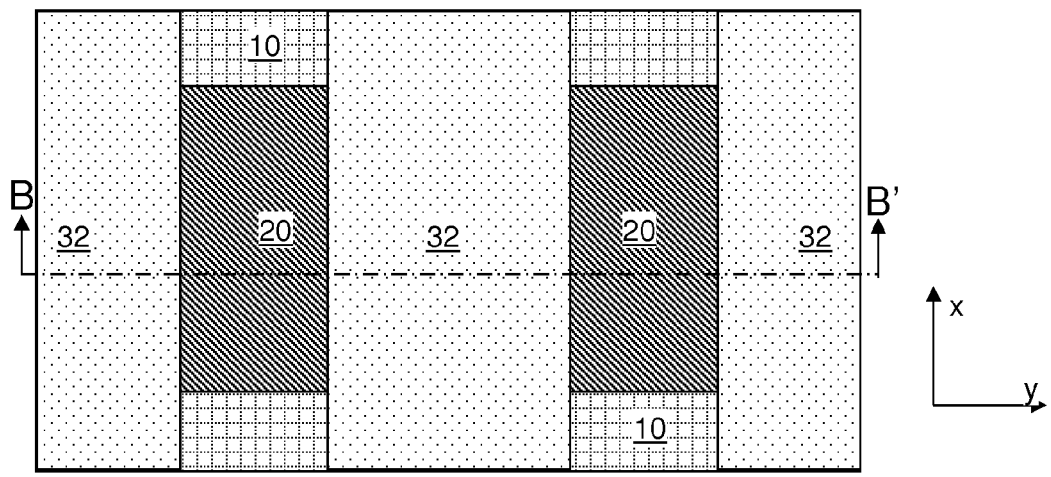
FIG. 2A is a top-down view of the first exemplary structure after formation of line trenches through the alternating stack according to the first embodiment of the present disclosure.
Figure 2B:
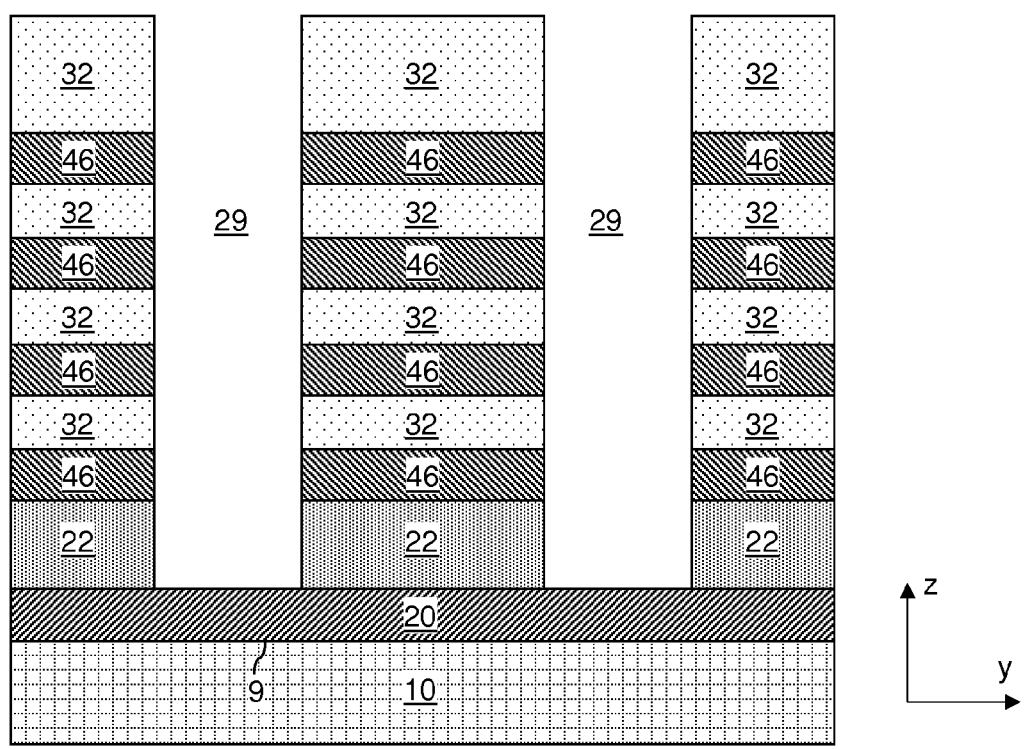
FIG. 2B is a vertical cross-sectional view of the first exemplary structure along the vertical plane B-B' of FIG. 2A.

Referring to FIGS. 2A and 2B, line trenches 29 can be formed through the alternating stack (32L, 46L) to divide the alternating stack (32L, 46L) of the electrically conductive layers 46L and the electrically insulating layers 32L into multiple line stacks of electrically conductive lines 46 and electrically insulating lines 32. As used herein, a "line trench" refers to a trench laterally extending along a first lateral direction by a greater lateral dimension than along a second lateral direction that is perpendicular to the first lateral direction.

Each line trench 29 is etched in, and through, the alternating plurality of electrically conductive layers 46L and electrically insulating layers 32L. Stacks of an alternating plurality of electrically conductive lines 46 elongated in the first direction (e.g., the x-direction) and electrically insulating lines 32 elongated in the first direction are formed from remaining portions of the alternating plurality of electrically conductive layers 46L and electrically insulating layers 32L. Each alternating stack of electrically conductive lines 46 and electrically insulating lines 32 is herein referred to as a line stack (32, 46). The electrically conductive lines 46 are elongated in the first direction, which is substantially parallel to the major surface 9 of the substrate 10. The electrically insulating lines 32 are elongated in the first direction. Each one of the plurality of electrically conductive lines 46 in a stack is electrically insulated from the other electrically conductive lines 46 in the same stack and in other stacks.

In one embodiment, the line trenches 29 can extend over a plurality of electrically conductive patterned structures 20. In one embodiment, the plurality of electrically conductive patterned structures 20 can extend along a second direction (e.g., the y-direction), which is the second horizontal direction, and the line trenches 29 can extend along the first direction. In one embodiment, the line trenches 29 can have a substantially uniform width that is invariant under translation along the first direction. In one embodiment, the line trenches 29 can have substantially vertical sidewalls. In another embodiment, the line trenches 29 can have tapered sidewalls such that each line trench 29 is wider at the top than at the bottom.

In one embodiment, each line trench 29 can have the same width at the bottom as at the top, and each stack can have substantially vertical sidewalls such that the bottom of the stack has the same width as the top of the stack. In another embodiment, each line trench 29 can be wider at the top than at the bottom, and each stack can be tapered such that the bottom of the stack is wider than the top of the stack.

Figure 3A:
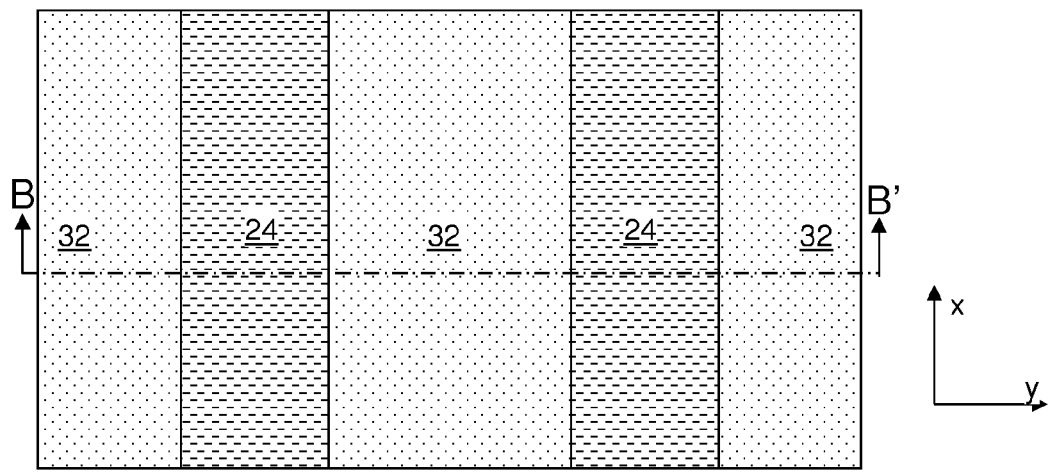
FIG. 3A is a top-down view of the first exemplary structure after formation of trench isolation structures according to the first embodiment of the present disclosure.
Figure 3B:
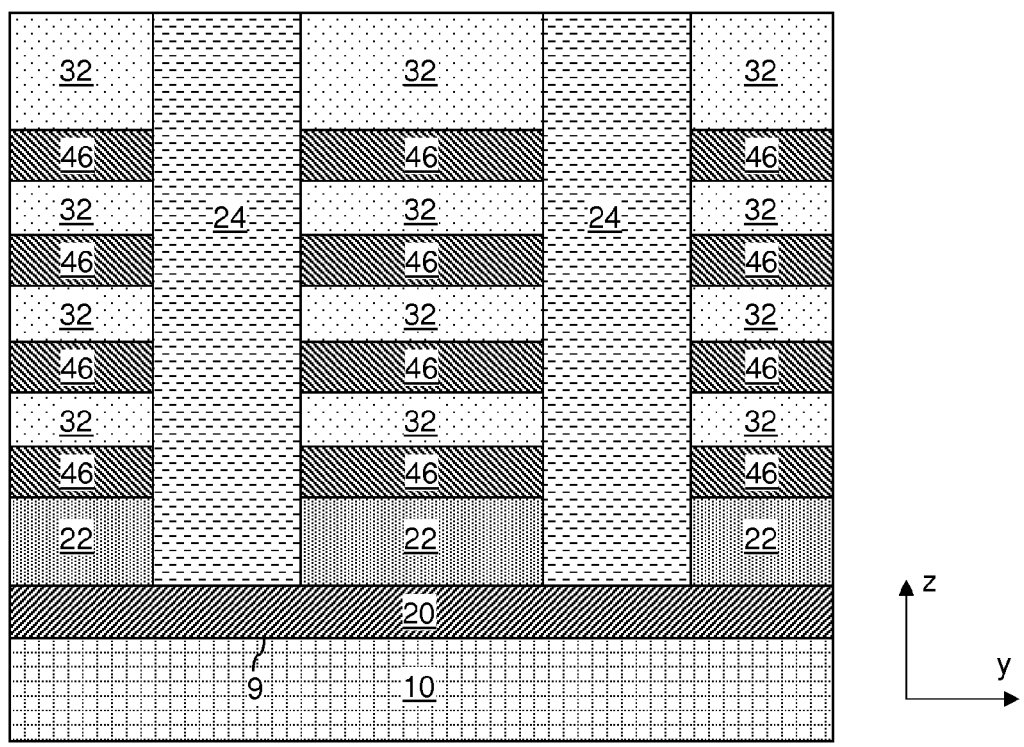
FIG. 3B is a vertical cross-sectional view of the first exemplary structure along the vertical plane B-B' of FIG. 3A.

Referring to FIGS. 3A and 3B, a dielectric material can be deposited in the line trenches 29 to fill the line trenches 29. The dielectric material can be different from the dielectric material of the electrically insulating lines 32. For example, if the dielectric material of the electrically insulating lines 32 includes silicon oxide, the dielectric material deposited in the line trenches 29 can include silicon nitride. Portions of the deposited dielectric material located above the top surface of the alternating stacks, i.e., the line stacks (32, 42), are removed by a planarization process. The planarization process can employ, for example, chemical mechanical planarization and/or a recess etch. Each remaining portion of the dielectric material in the line trenches 29 constitutes a trench isolation structure 24. Line stacks (32, 46) are laterally spaced along the second direction (e.g., the y-direction), which can be a horizontal direction that is perpendicular to the first direction (e.g., the x-direction), by at least one trench isolation structure 24. In one embodiment, the top surfaces of the trench isolation structures 24 can be coplanar with the top surfaces of the line stacks (32, 46).

Figure 4A:
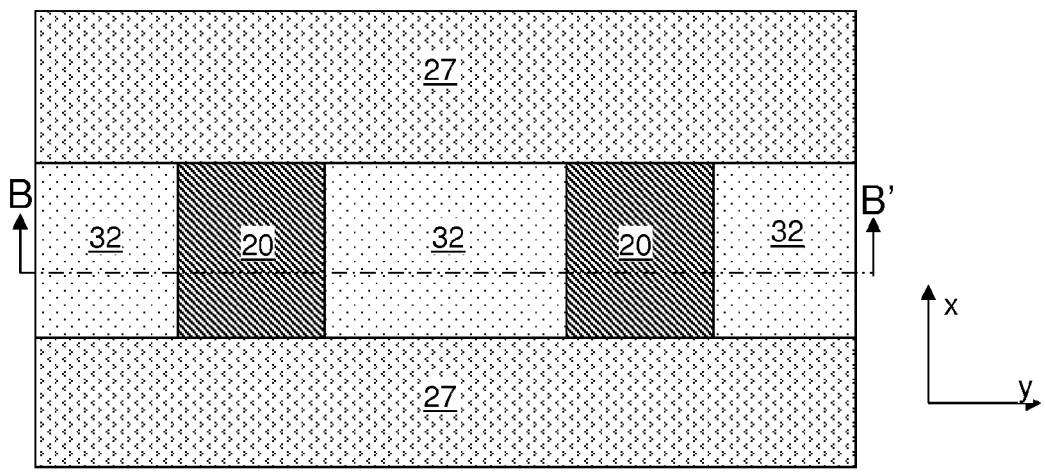
FIG. 4A is a top-down view of the first exemplary structure after formation of memory openings according to the first embodiment of the present disclosure.
Figure 4B:
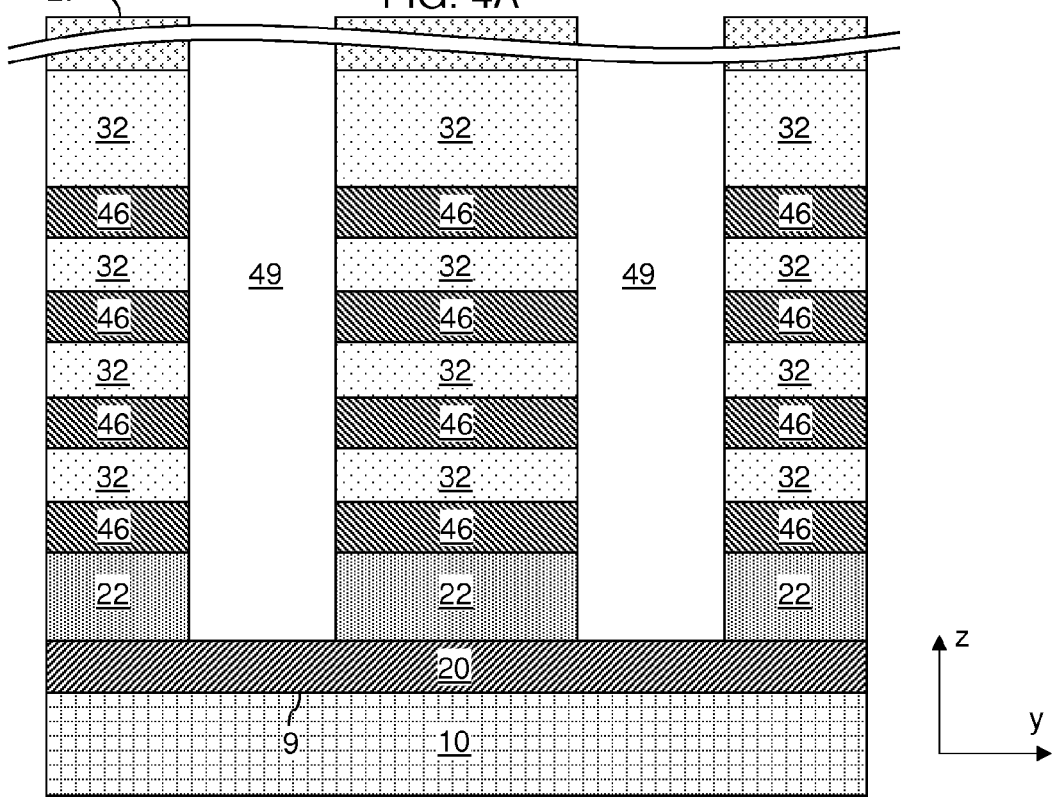
FIG. 4B is a vertical cross-sectional view of the first exemplary structure along the vertical plane B-B' of FIG. 4A.

Referring to FIGS. 4A and 4B, a photoresist layer 27 can be applied over the top surface of the line stacks (32, 46) and the trench isolation structures 24, and can be lithographically patterned to form openings that extend along the second direction (e.g., the y-direction). Line trenches can be formed in the patterned photoresist layer 27. Each portion of the trench isolation structure 24 that does not underlie the patterned photoresist layer 27 can be removed by an anisotropic etch, which can be a reactive ion etch, that is selective to the material of the topmost electrically insulating layer 32.

As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

A memory opening 49 is formed through a portion of the volume of a line trench 29 (See FIG. 2) by removing a contiguous portion of the dielectric material of the trench isolation structure 24 that fills the line trench 29 and does not underlie the patterned photoresist layer 27. The anisotropic etch can include at least one reactive ion etch process that removes the dielectric material of the trench isolation structures 24 selective to the dielectric material of the topmost electrically insulating layer 32. At least an upper portion of a first set of sidewalls of each memory opening 49 can be vertically coincident with sidewalls of the patterned photoresist layer 27. At least an upper portion of a second set of sidewalls of each memory opening 49 can be vertically coincident with sidewalls of a pair of line stacks (32, 46). As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Each trench isolation structure 24 is divided into a plurality of portions that are laterally spaced along the first direction (e.g., the x-direction) by a linear array of memory openings 49. Each remaining contiguous portion of the trench isolation structure 24 after the anisotropic etch constitutes a smaller trench isolation structure 24 that occupies a lesser volume than the entire volume of a corresponding line trench 29 as formed at the processing steps of FIGS. 1A and 1B.

Figure 5A:
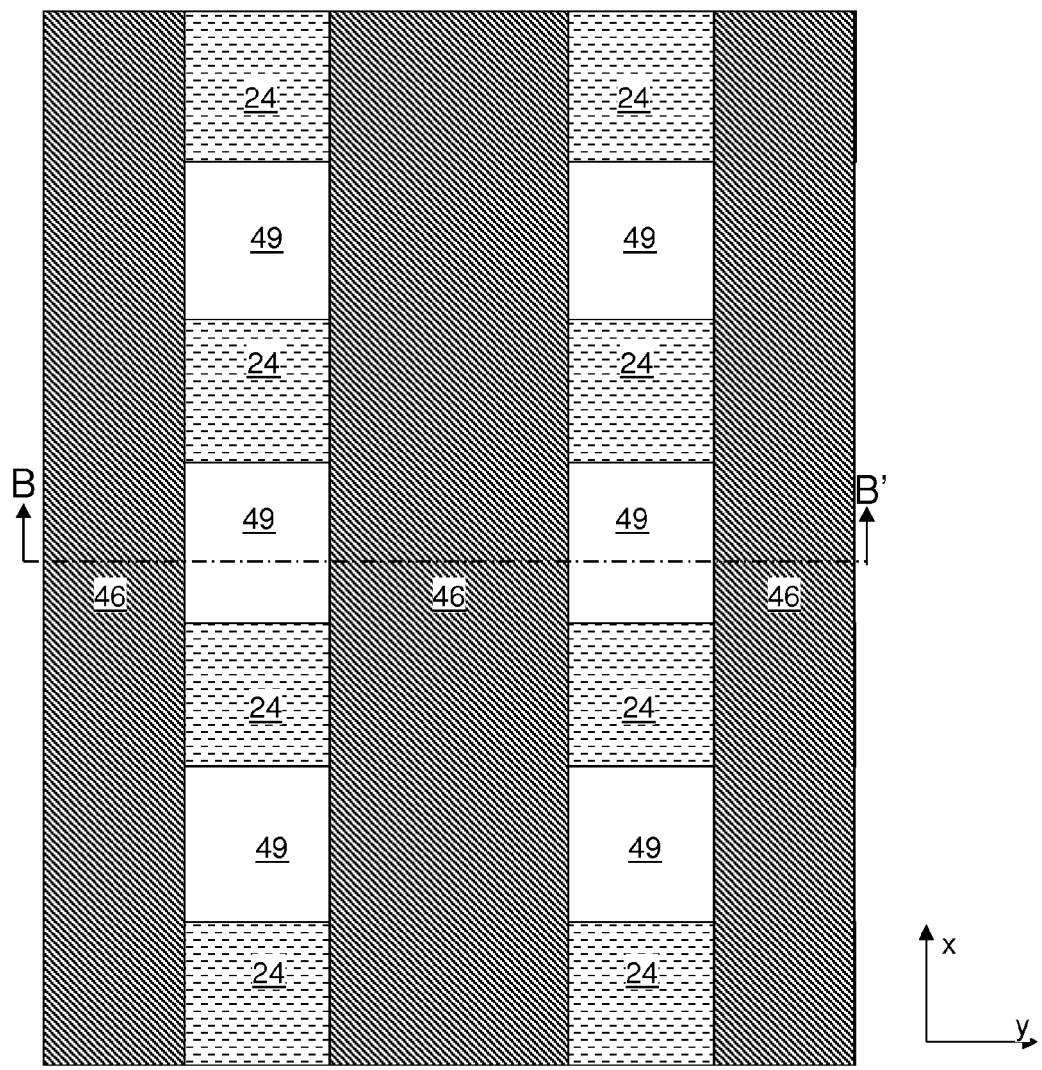
FIG. 5A is a horizontal cross-sectional view of the first exemplary structure after removal of a patterned photoresist layer along the horizontal plane A-A' of FIG. 5B according to the first embodiment of the present disclosure.
Figure 5B:
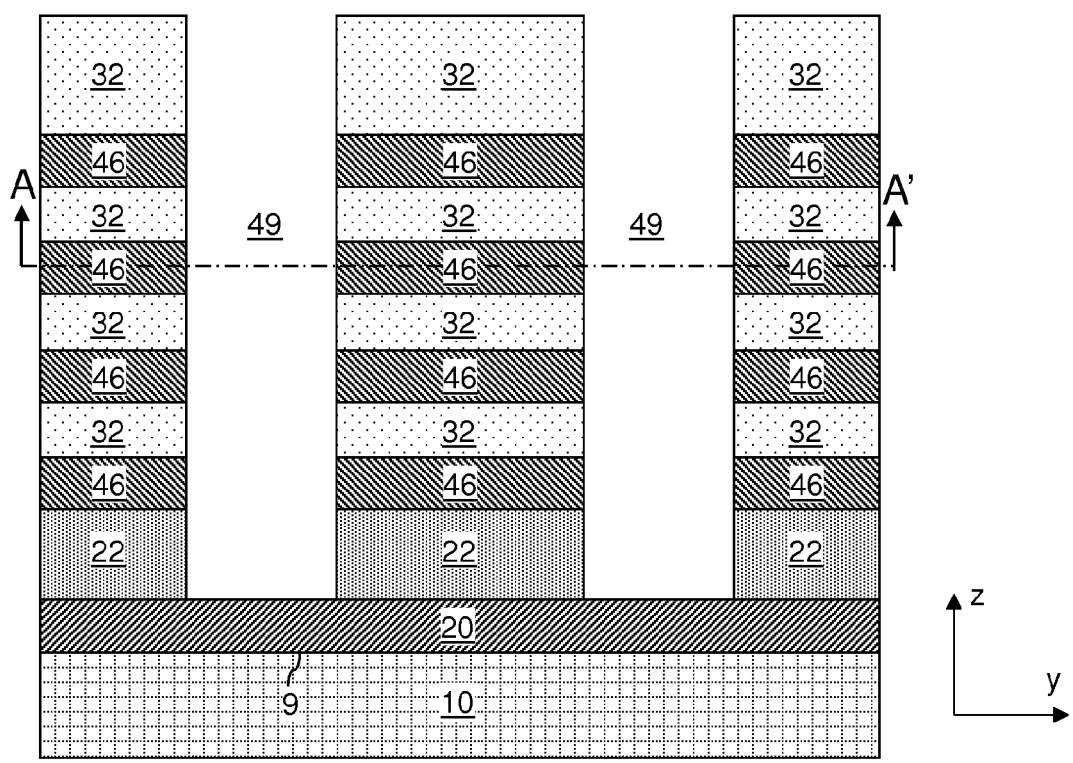
FIG. 5B is a vertical cross-sectional view of the first exemplary structure along the vertical plane B-B' of FIG. 5A.

Referring to FIGS. 5A and 5B, the patterned photoresist layer 27 can be removed, for example, by ashing. A two-dimensional array of memory openings 49 can be provided over the substrate 10. Along the first direction (e.g., the x-direction), each memory opening 49 can be laterally spaced from at least another memory opening 49 by at least one trench isolation structure 24. In one embodiment, an alternating sequence of memory openings 49 and trench isolation structures 24 can be present along the first direction. Along the second direction (e.g., the y-direction), each memory opening 49 can be laterally spaced from at least another memory opening 49 by at least one line stack (32, 46). In one embodiment, an alternating sequence of memory openings 49 and line stacks (32, 46) can be present along the second direction. In addition, an alternating sequence of trench isolation structures 24 and line stacks (32, 46) can be present along the second direction in addition to the alternating sequence of memory openings 49 and line stacks (32, 46).

Figure 6A:
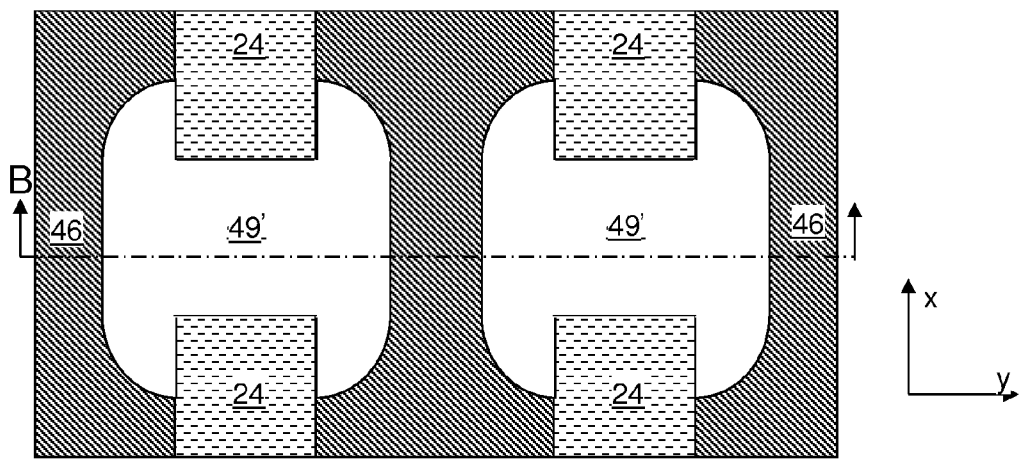
FIG. 6A is a horizontal cross-sectional view of the first exemplary structure after selective lateral expansion of the memory openings along the horizontal plane A-A' of FIG. 6B according to the first embodiment of the present disclosure.
Figure 6B:
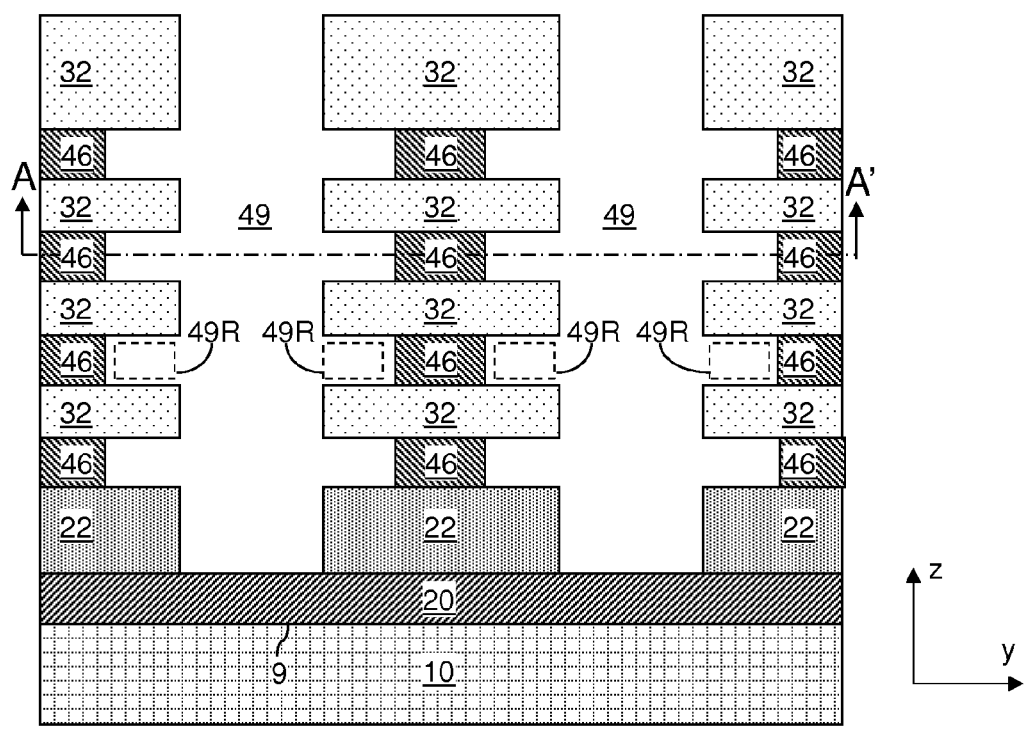
FIG. 6B is a vertical cross-sectional view of the first exemplary structure along the vertical plane B-B' of FIG. 6A.

Referring to FIGS. 6A and 6B, a selective etching process is performed on the memory openings 49. Specifically, the plurality of electrically conductive lines 46 is selectively etched to form a plurality of recesses 49R in each line stack (32, 46). Each recess 49R of the plurality of recesses 49R is formed adjacent to a respective one of the plurality of electrically conductive lines 46, and is overhung by a respective one of the plurality of electrically insulating lines 32 in each line stack (32, 46). As used herein, a region is "overhung" by an element if the element overlies the region. Each of the plurality of electrically conductive lines 46 can be recessed in the second direction (e.g., the y-direction) which is substantially perpendicular to the first direction (e.g., the x-direction) and is substantially parallel to the major surface 9 of the substrate 10.

In an illustrative example, a first plurality of electrically conductive lines 46 can be etched to form a first plurality of recesses in a first stack, i.e., a first line stack (32, 46), and a second plurality of electrically conductive lines 46 can be etched to form a second plurality of recesses in the second stack, i.e., a second line stack (32, 46), that is laterally spaced from the first line stack (32, 46) by at least one memory opening 49 contained within a line trench, within which a plurality of trench isolation structures 24 can be present. Each recess of the first plurality of recesses can be formed adjacent to a respective one of the plurality of electrically conductive lines 46, and can be overhung by a respective one of the plurality of electrically insulating lines 32 in the first stack. Each recess of the second plurality of recesses can be formed adjacent to a respective one of the plurality of electrically conductive lines 46, and can be overhung by a respective one of the plurality of electrically insulating lines 32 in the second stack. In one embodiment, a line trench can comprise a first sidewall comprising the first plurality of recesses 49R and a second sidewall comprising a second plurality of recesses 49R.

Figure 7A:
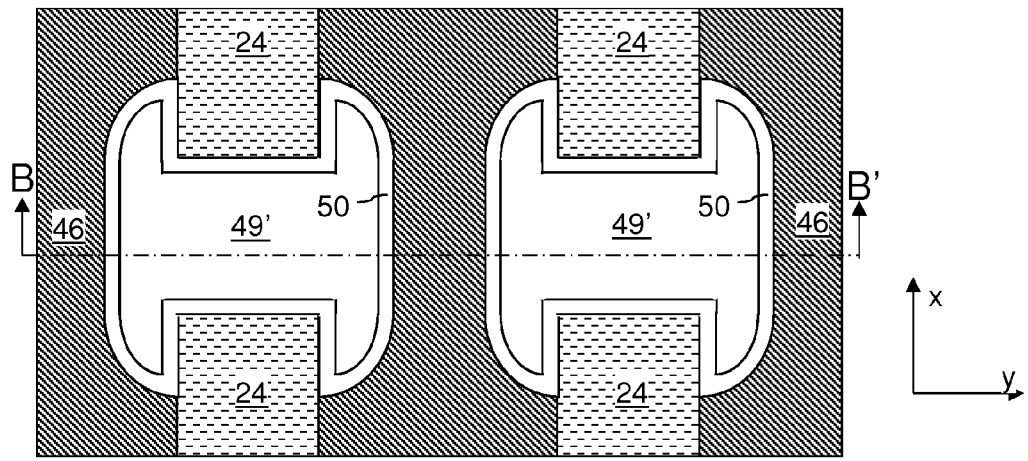
FIG. 7A is a horizontal cross-sectional view of the first exemplary structure after formation of a read/write memory material layer along the horizontal plane A-A' of FIG. 7B according to the first embodiment of the present disclosure.
Figure 7B:
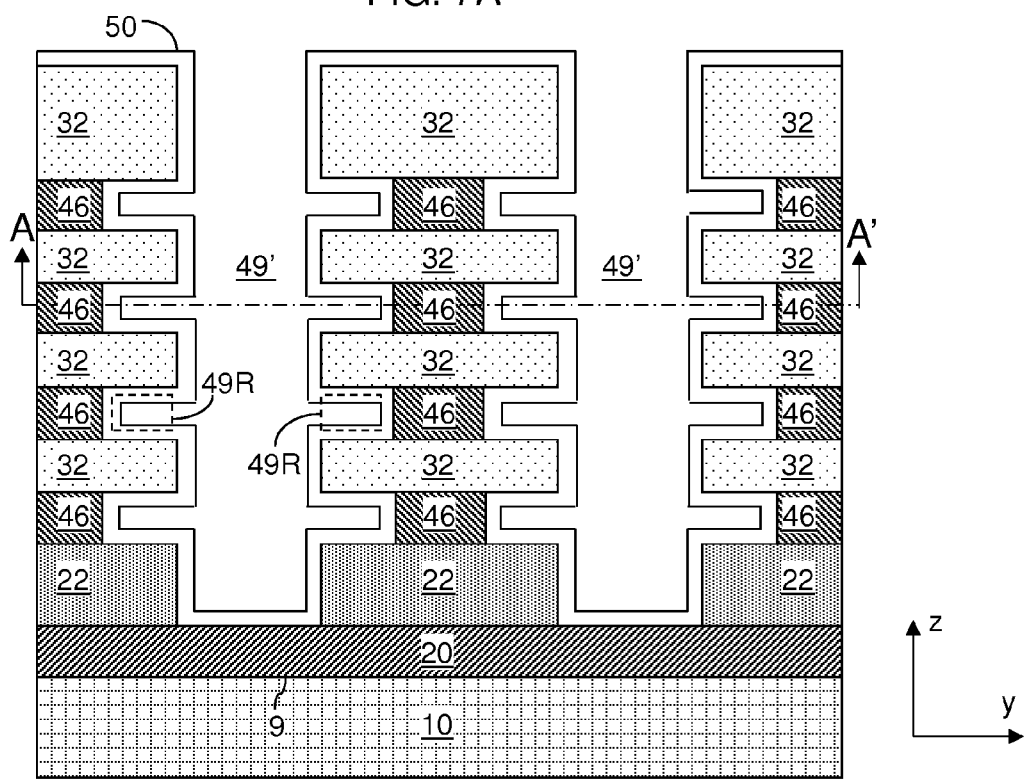
FIG. 7B is a vertical cross-sectional view of the first exemplary structure along the vertical plane B-B' of FIG. 7A.

Referring to FIGS. 7A and 7B, a read/write memory material is conformally deposited on the sidewalls and the bottom surfaces of the memory openings 49 and over the topmost electrically insulating lines 32. The read/write memory material is a material that can have different electrical resistivity depending on the state, the phase, or the density of microscopic structures such as filaments, within the material. In one embodiment, the read/write memory material can be a non-volatile memory (NVM) material selected from a chalcogenide and a metal oxide material, and exhibits a stable, reversible shift in resistance in response to an external voltage applied to the material or to a current passed through the material. The conformal layer of the read/write memory material is herein referred to as a read/write memory material layer 50. A portion of the read/write memory material layer 50 is present within each recess 49R. In one embodiment, for each of the plurality of recesses 49R, the read/write memory material is conformal to, and partially fills, the recess 49, thereby defining a notch in the read/write memory material within the recess 49R.

The read/write memory material layer 50 can be formed by a conformal deposition method such as atomic layer deposition (ALD) or low pressure chemical vapor deposition (LPCVD). As a conformal material layer, the read/write memory material layer 50 can have substantially the same thickness throughout. The thickness of the read/write memory material layer 50 can be in a range from 2 nm to 10 nm, although lesser and greater thicknesses can also be employed. A cavity 49' is formed within each volume of the memory opening that is not filled with the read/write memory material layer 50.

Figure 8A:
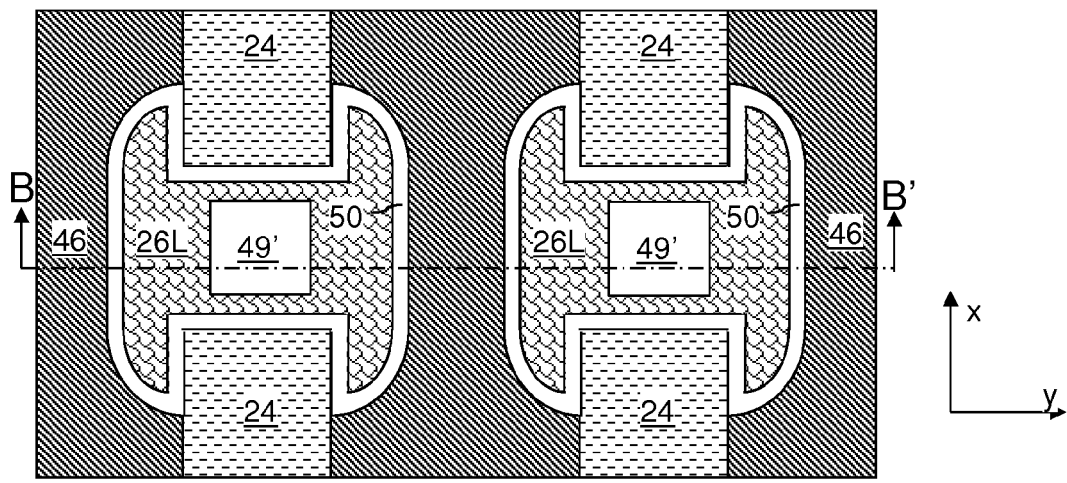
FIG. 8A is a horizontal cross-sectional view of the first exemplary structure after formation of a protective material layer along the horizontal plane A-A' of FIG. 8B according to the first embodiment of the present disclosure.
Figure 8B:
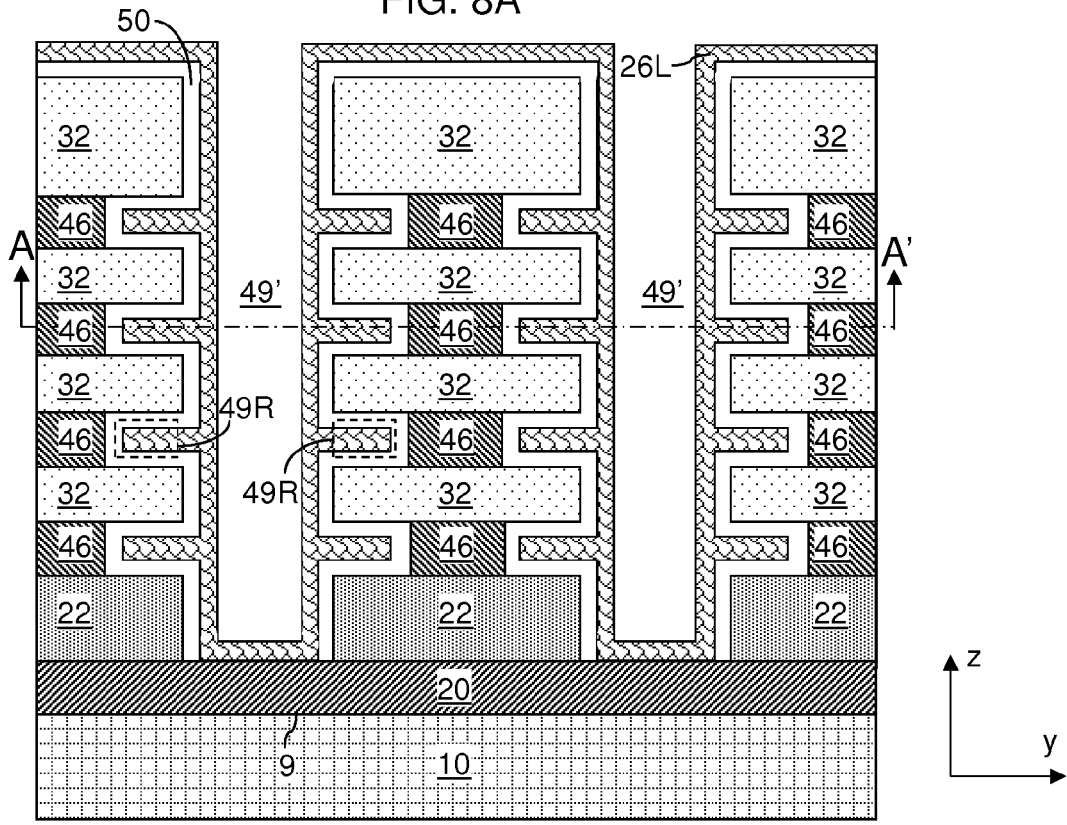
FIG. 8B is a vertical cross-sectional view of the first exemplary structure along the vertical plane B-B' of FIG. 8A.

Referring to FIGS. 8A and 8B, a protective material layer 26L can optionally be deposited on the physically exposed surfaces of the read/write memory material layer 50. The protective material layer 26L is optional, and can be omitted. The protective material layer 26L includes a protective material, which is a conductive material that is different from the read/write memory material. The protective material can be a doped semiconductor material such as doped polysilicon, or can be a metallic material such as a conductive metallic nitride (e.g., titanium nitride). The protective material layer 26L can be deposited by a conformal deposition method such as low pressure chemical vapor deposition (LPCVD) or atomic layer deposition (ALD). In one embodiment, the protective material layer 26L can be a conformal polysilicon layer.

The thickness of the protective material layer 26L can be selected such that each recess 49R is completely filled with the read/write memory material and the protective material. Thus, for each one of the plurality of recesses 49R, the read/write memory material can partially fill the recess 49R, and a protective material different from the read/write memory material can fill the remainder of the recess 49R. The thickness of the protective material layer 26L, as measured over the top surface of the topmost electrically insulating layer 32, can be in a range from 3 nm to 50 nm, although lesser and greater thicknesses can also be employed.

Figure 9A:
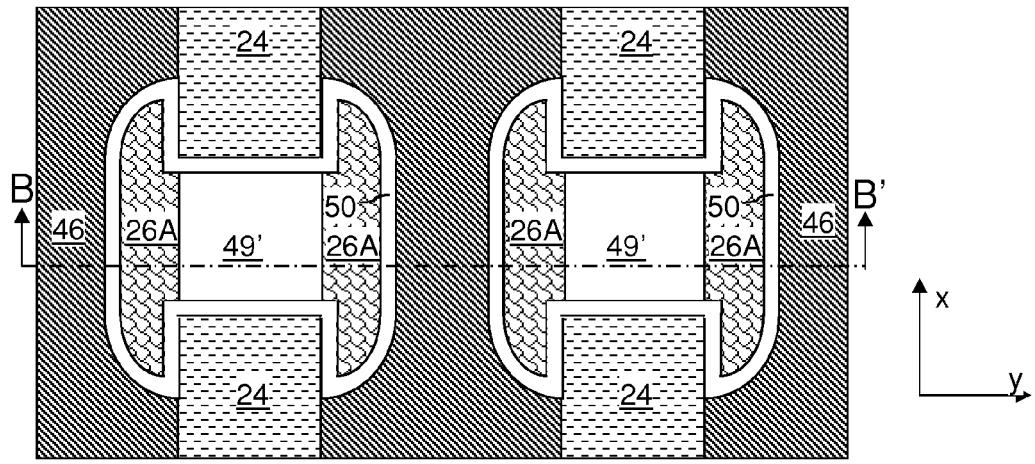
FIG. 9A is a horizontal cross-sectional view of the first exemplary structure after anisotropically etching the protective material layer and the read/write memory material layer along the horizontal plane A-A' of FIG. 9B according to the first embodiment of the present disclosure.
Figure 9B:
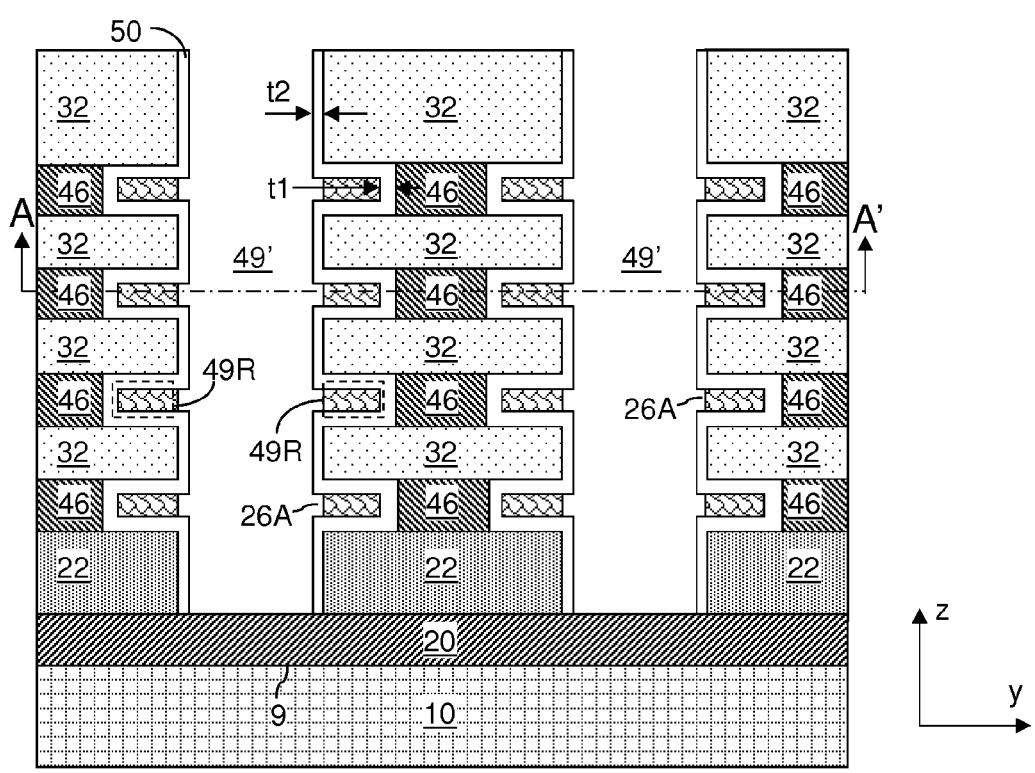
FIG. 9B is a vertical cross-sectional view of the first exemplary structure along the vertical plane B-B' of FIG. 9A.

Referring to FIGS. 9A and 9B, the optional protective material layer 26L and the read/write memory material layer 50 can be etched employing an etch process. Portions of the optional protective material layer 26L and the read/write memory material layer 50 located outside of the plurality of recesses 49R can be selectively removed by etching the read/write memory material layer 50 by the etch process.

In one embodiment, the etch process can include a first etch step that removes the protective material selective to the read/write memory material. The sidewalls of the read/write memory material layer 50 is physically exposed at each level of the electrically isolating lines 32, while a remaining portion of the protective material protects a portion of the read/write memory material layer 50 located directly on a sidewall of an electrically conductive line 46 at the level of the electrically conductive line 46. Each remaining portion of the protective material layer 26L constitutes a protective material portion 26. The first etch step can include an isotropic etch process, or an anisotropic etch process such as a reactive ion etch.

The etch process can further include a second etch step that removes the physically exposed portions of the read/write memory material. During the second step of the etch process, portions of the read/write memory material layer 50 extending into the plurality of recesses 49R are substantially protected from the etching by a protective material portion. Thus, portions of the read/write memory material layer 50 located outside of the plurality of recesses 49R is selectively removed with respect to portions of the read/write memory material layer 50 located within the plurality of recesses 49R. The second etch step can include an anisotropic etch process such as a reactive ion etch, or an isotropic etch process.

Horizontal portions of the read/write memory material layer 50 above the top surfaces of the topmost electrically insulating lines 32 and on the physically exposed portions of the top surfaces of the electrically conductive patterned structures 20 are removed by the anisotropic etch process. The second step of the etch process can be an anisotropic etch process that removes the horizontal portions of the read/write memory material layer 50 at a greater etch rate than the vertical portions of the read/write memory material layer 50 located on the electrically insulating lines 32. If an anisotropic etch process is employed, the step of selectively removing portions of the read/write memory material layer 50 can leave a read/write memory material residue on sidewalls of the plurality of electrically insulating lines 32. The portions of the read/write memory material layer 50 located on the electrically conductive lines 46 can be protected from the etch chemistry of the anisotropic etch process by the protective material portions 26A. Thus, while a significant collateral etching of the material of the read/write memory material layer 50 occurs on the sidewalls of the electrically insulating lines 32 around each memory opening, the portions of the read/write memory material layer 50 that contact the sidewalls of the electrically conductive lines 46 are not etched.

The portions of the read/write memory material layer 50 on the sidewalls of the electrically insulating lines 32 can be thinner than the read/write memory material at least partially filling the plurality of recesses 49R. The read/write memory material layer 50, as present in the first exemplary structure after the anisotropic etch, can have a first thickness t1 on a sidewalls of an electrically conductive line 46, and a second thickness t2 on a sidewall of an electrically insulating line 32 such that the first thickness t1 is greater than the second thickness t2. Thus, for each recess of the plurality of recesses 49R, a thickness in the second direction (such as the second thickness t2) of the read/write memory material at least partially filling the recess 49R can be greater than a thickness in the second direction (such as the first thickness t1) of a read/write memory material residue formed on sidewalls of the plurality of electrically insulating lines 46. In one embodiment, the first thickness t1 can be substantially the same as the thickness of the read/write memory material layer 50 as deposited at the processing steps of FIGS. 7A and 7B.

The trench floor at the bottom of each memory opening can comprise a layer of an electrically conductive material such as the material of the electrically conductive patterned structures 20. The duration of the anisotropic etch can be selected such that the trench floor is substantially free of read/write memory material residue. The read/write memory material at least partially fills each of the plurality of recesses 49R, and the protective material of the protective material portions 26A, which is an electrically conductive fill material, extends at least partially each of the plurality of recesses 49R. In other words, the read/write memory material can partially fill each recess 49R and a protective material different from read/write memory material fills the remainder of the recess 49R and physically contacts the electrically conductive fill material, i.e., the protective material.

Figure 10A:
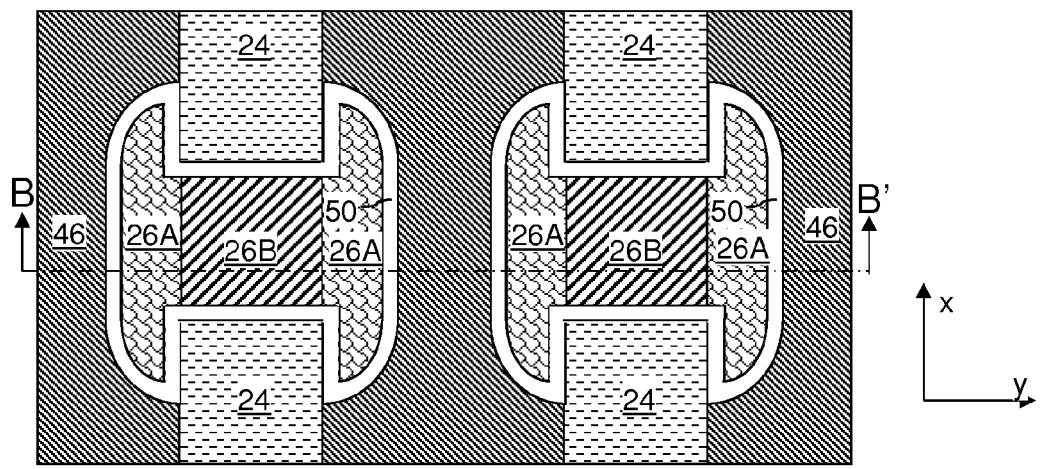
FIG. 10A is a horizontal cross-sectional view of the first exemplary structure after formation of electrically conductive bit lines along the horizontal plane A-A' of FIG. 10B according to the first embodiment of the present disclosure.
Figure 10B:
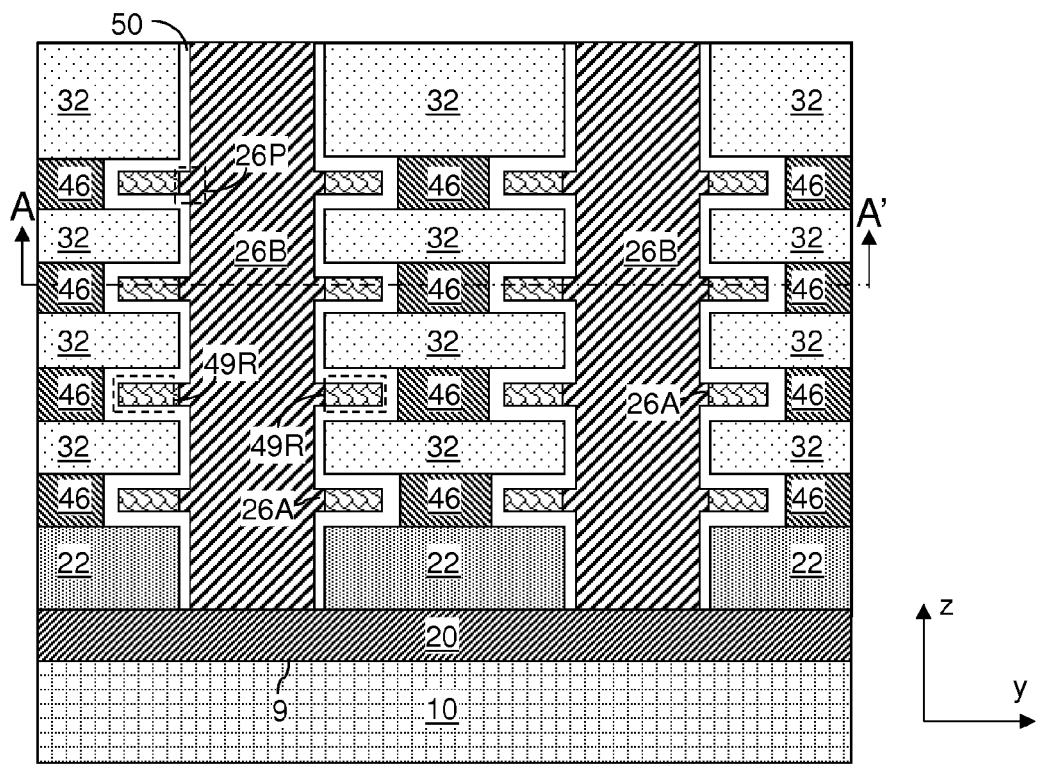
FIG. 10B is a vertical cross-sectional view of the first exemplary structure along the vertical plane B-B' of FIG. 10A.

Referring to FIGS. 10A and 10B, a conductive material can be deposited in the cavities 49' so that the cavities 49' are filled with the conductive material. Excess portions of the conductive material from above the top surface of the topmost insulating material lines 32 can be removed by a planarization process, which can include, for example, chemical mechanical planarization (CMP) and/or a recess etch. Each remaining conductive material portion that fills a cavity 49' can constitute an electrically conductive bit line 26B. Each electrically conductive bit line (26A, 26B) is elongated in a third direction substantially perpendicular to the major surface 9 of the substrate 10 (e.g., the z-direction).

In one embodiment, each electrically conductive bit line 26B can be in electrical contact with the read/write memory material of the read/write memory material layer 50. If the protective material portions 26A are not employed, the deposited conductive material can be present within portions of each recess 49R, and each electrically conductive bit line 26B can include laterally protruding portions that occupy the volumes recessed 49B.

Each electrically conductive bit line 29B comprises an electrically conductive fill material filling the trench of a memory opening, and is in electrical contact with the layer of electrically conductive material at the trench floor, i.e., with the electrically conductive patterned structures 20. Each contact region between the electrically conductive fill material within an electrically conductive bit line 26B and the layer of electrically conductive material at the trench floor is substantially free of read/write memory material residue.

The exemplary structure includes a first stack comprising an alternating plurality of electrically conductive lines 46 elongated in a first direction (e.g., the x-direction) substantially parallel to the major surface 9 of the substrate 10 and electrically insulating lines 32 elongated in the first direction. Each of the first plurality of electrically conductive lines 46 is recessed in a second direction (e.g., the y-direction) below an adjacent electrically insulating line 32 to form a first plurality of recesses 49R. The second direction can be substantially perpendicular to the first direction, and can be substantially parallel to the major surface 9 of the substrate 10. Each recess 49R of the first plurality of recesses 49R is formed adjacent to a respective one of the plurality of electrically conductive lines 32, and is overhung by a respective one of the plurality of electrically insulating lines 32 in the first stack. In one embodiment, the plurality of electrically conductive lines 46 in the first stack comprises a metal nitride, and the plurality of electrically insulating lines 32 in the first stack comprises an insulating oxide.

Each recess 49R in the plurality of recesses 49R corresponds to a respective memory cell in a memory device. The electrically conductive line 46 adjacent the recess 49R comprises, or is in electrical contact with, a word line for the memory cell. The read/write memory material can comprise a non-volatile memory (NVM) material, and the memory device can comprise a monolithic three dimensional non-volatile ReRAM memory device. For each recess 49R, the read/write memory material layer 50 can be conformal to, and partially fill, the recess 49R, thereby defining a notch in the read/write memory material. The protective material of the protective material portions 26A can be a first electrically conductive material extending into the notch in the read/write memory material within each recess 49R, and in electrically contact with a second electrically conductive material of an electrically conductive bit line 26B. In one embodiment, an electrically conductive bit line 26B can be formed such that portions of the electrically conductive bit line 26B extend into the notches in the read/write memory material. Each electrically conductive line 46 of the plurality of electrically conductive lines 46 in the first stack is electrically insulated from the other electrically conductive lines 46 in the first stack.

The exemplary structure can further include a second stack comprising an alternating plurality of electrically conductive lines 46 elongated in the first direction and electrically insulating lines 32 elongated in the first direction. Each of the plurality of electrically conductive lines 46 is recessed in a second direction below an adjacent electrically insulating line 32 to form a second plurality of recesses. The read/write memory material of a portion of a read/write memory material layer 50 at least partially fills each of the second plurality of recesses 49R. A trench of the same memory opening as the memory opening on which the first stack is present can extend in the third direction. A first sidewall of the trench comprises the first plurality of recesses 49R at least partially filled with the read/write memory material, and a second sidewall of the trench comprises the second plurality of recesses 49R at least partially filled with the read/write memory material.

In one embodiment, the electrically conductive patterned structures 20 can be at least one electrically conductive global bit line extending in the second direction and in electrical contact with a first local bit line (e.g., a first electrically conductive bit line 26B), disposed in the first trench and a second local bit line (e.g., a second electrically conductive bit line 26B) disposed in the second trench that is laterally spaced from the first trench by at least one line stack (32, 46).

Figure 11A:
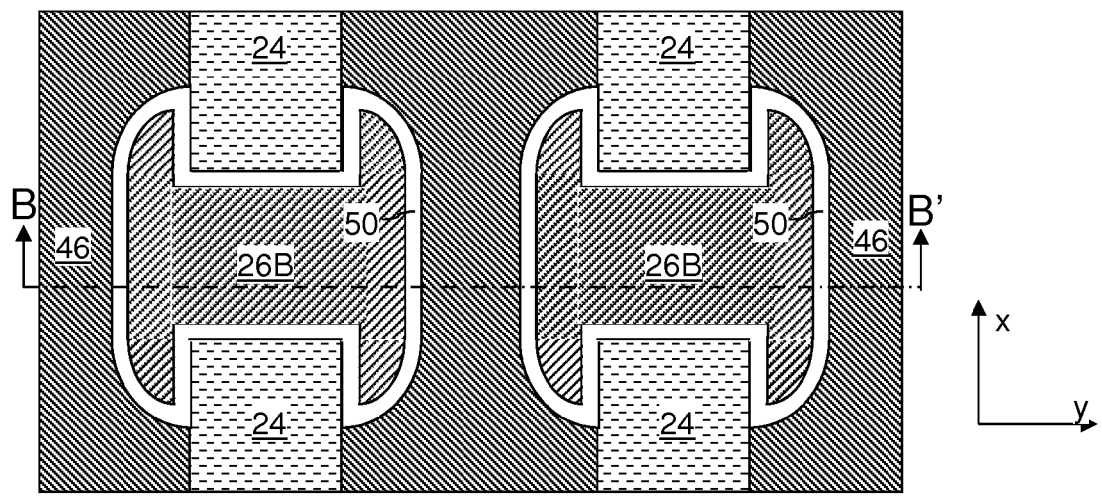
FIG. 11A is a horizontal cross-sectional view of a first alternative embodiment of the first exemplary structure along the horizontal plane A-A' of FIG. 11B according to the first embodiment of the present disclosure.
Figure 11B:
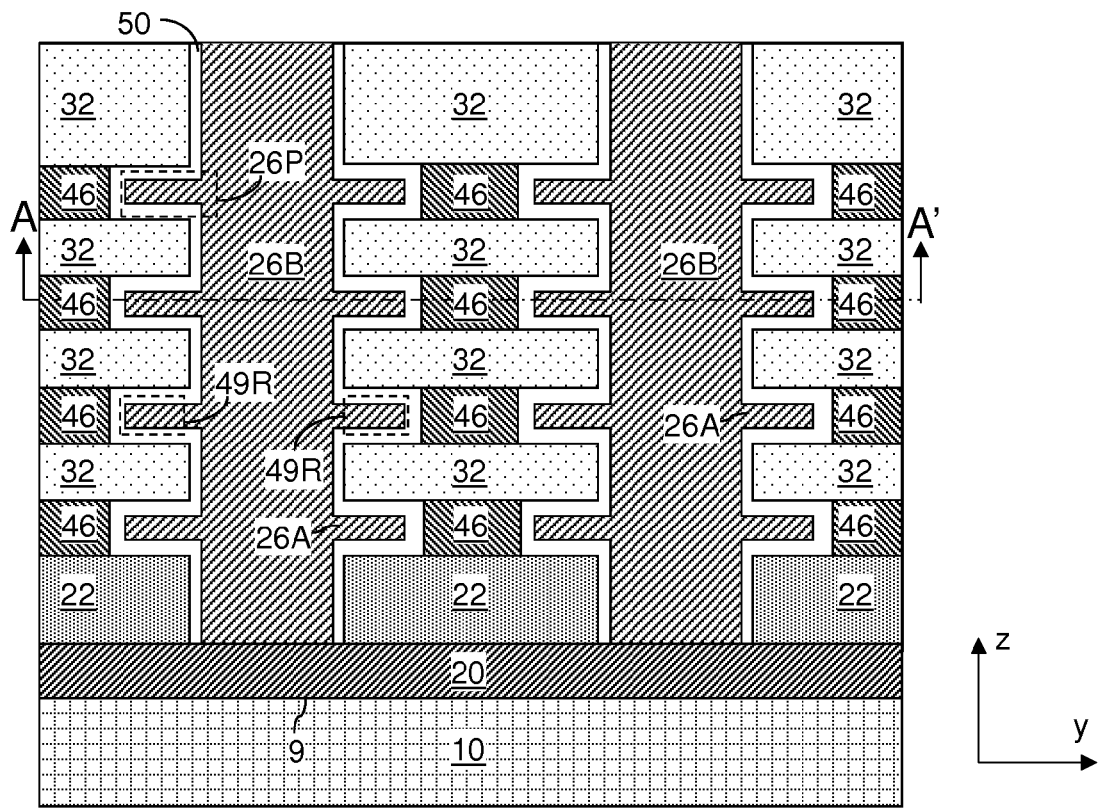
FIG. 11B is a vertical cross-sectional view of the first alternative embodiment of the first exemplary structure along the vertical plane B-B' of FIG. 11A.

Referring to FIGS. 11A and 11B, a first alternative embodiment of the first exemplary structure can be derived from the first exemplary structure by omitting formation of protective material portions 26A so that the electrically conductive bit lines fill the notch within each recess 49B that is not filled with the read/write memory material layer 50. If the protective material portions 26A are not employed, the deposited conductive material can be present within portions of each recess 49R, and each electrically conductive bit line 26B can include laterally protruding portions that occupy the volumes recessed 49B.

Figure 12A:
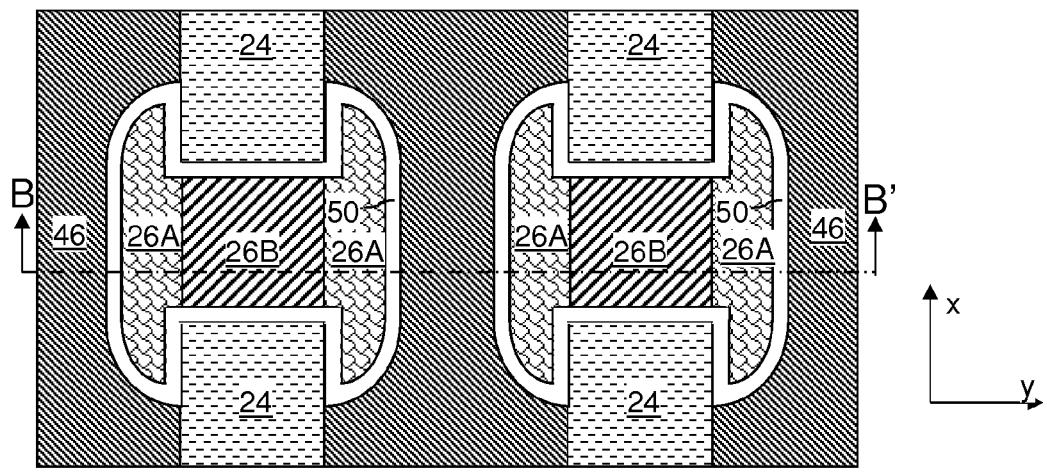
FIG. 12A is a horizontal cross-sectional view of a second alternative embodiment of the first exemplary structure along the horizontal plane A-A' of FIG. 12B according to the first embodiment of the present disclosure.
Figure 12B:
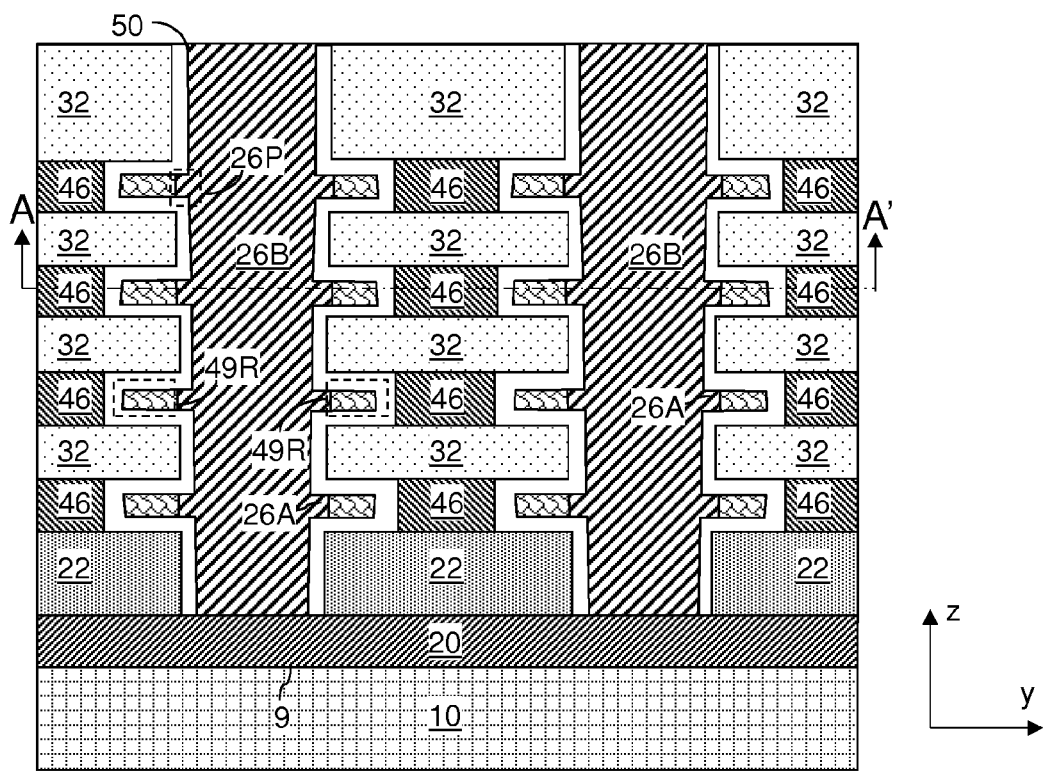
FIG. 12B is a vertical cross-sectional view of the second alternative embodiment of the first exemplary structure along the vertical plane B-B' of FIG. 12A.

Referring to FIGS. 12A and 12B, a second alternative embodiment of the first exemplary structure illustrates a configuration in which each trench including the trench isolation structures 24 and the memory openings are formed with a taper so that each memory opening and each trench isolation structure has a wider width at the top than at the bottom. In this case, within each line stack (32, 46), the bottommost electrically conductive line 46 can be wider than the topmost electrically conductive line 46, and the bottommost electrically insulating line 32 can be wider than the topmost electrically insulating line 32.

Figure 13A:
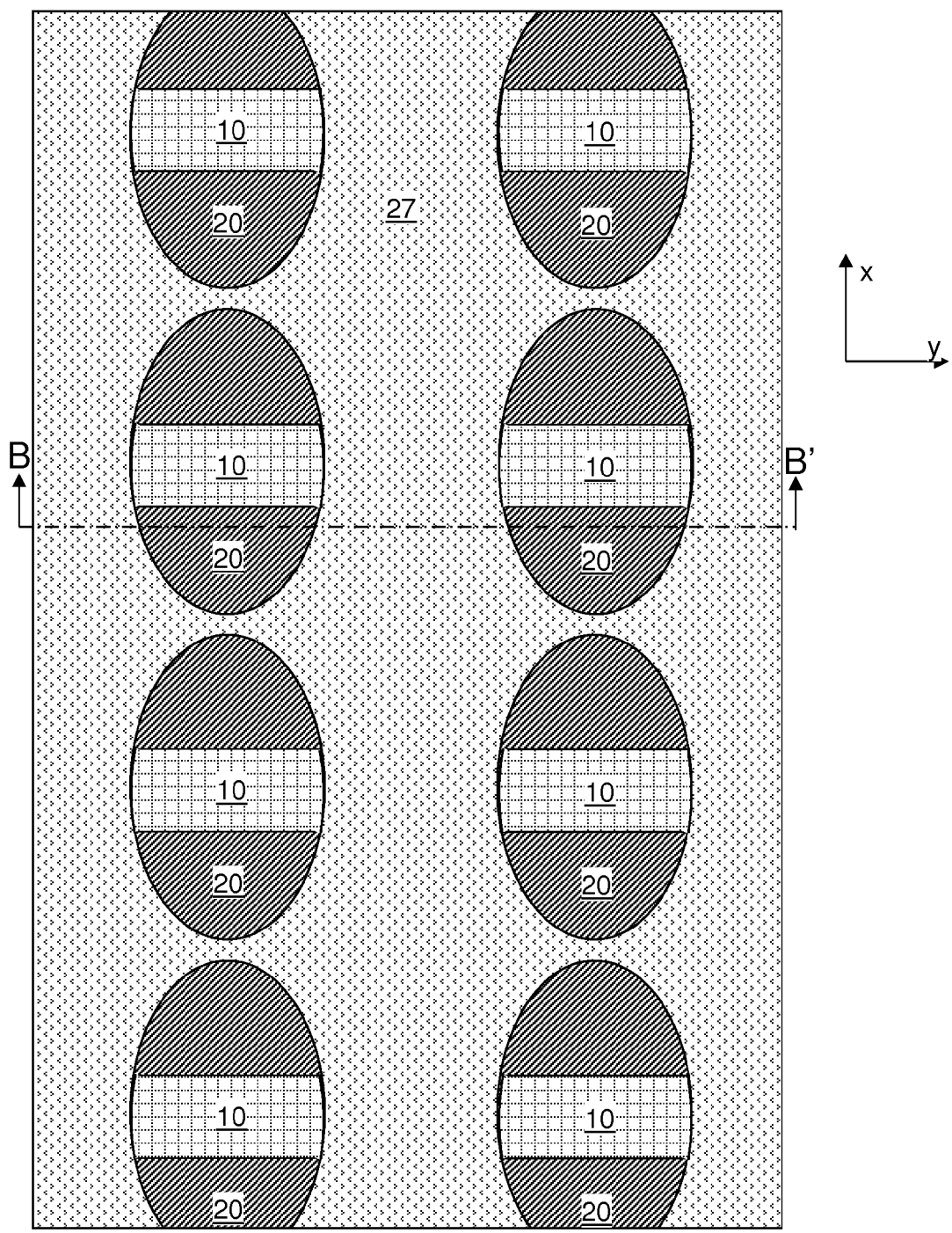
FIG. 13A is a top-down view of a second exemplary structure after application and patterning of a photoresist layer over an alternating stack of electrically insulating lines and electrically conductive layers according to a second embodiment of the present disclosure.
Figure 13B:
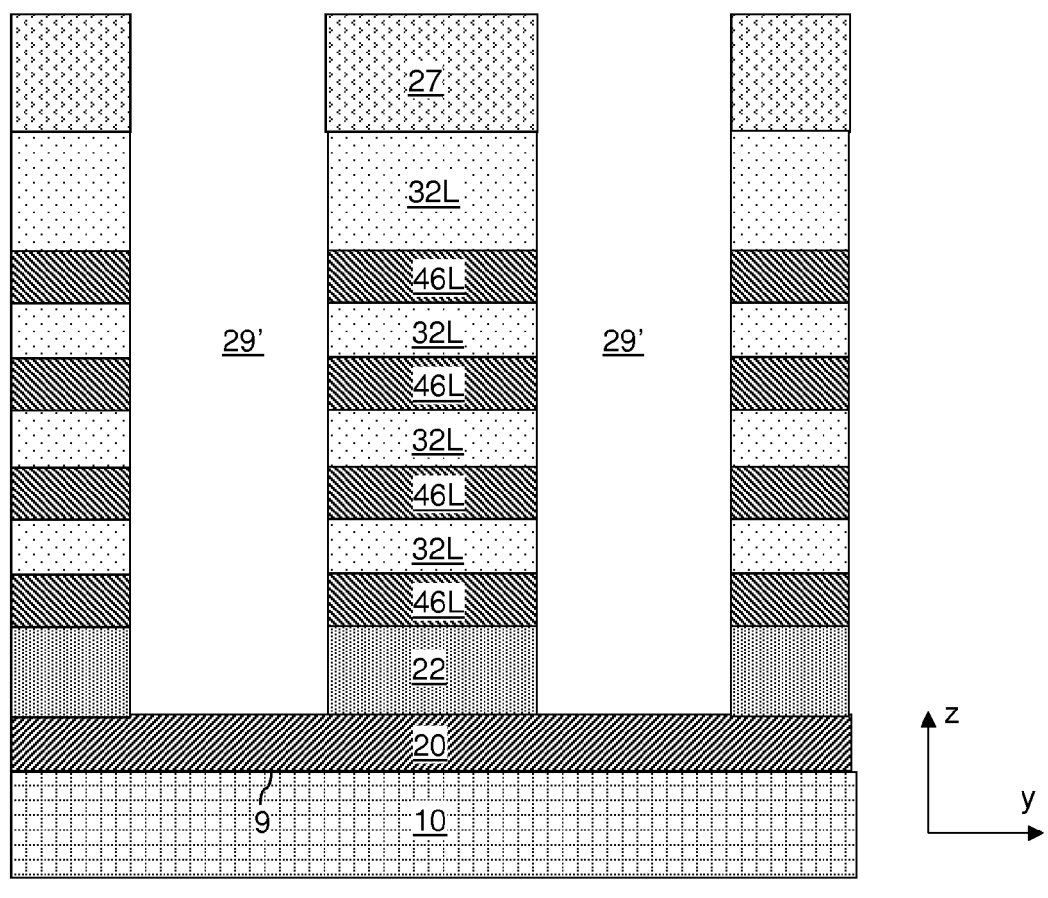
FIG. 13B is a vertical cross-sectional view of the second exemplary structure along the vertical plane B-B' of FIG. 13A.

Referring to FIGS. 13A and 13B, a second exemplary structure can be derived from the first exemplary structure of FIGS. 1A and 1B. As in the first embodiment, the electrically conductive patterned structures 20 can be electrically conductive global bit lines laterally spaced from each other along a first direction (e.g., the x-direction) and extending in a second direction (e.g., the y-direction). A mask layer 27 can be formed over the top surface of the alternating stack (32L, 46L; See FIGS. 1A and 1B), and can be lithographically patterned to form an array of openings therein. The mask layer 27 can be a soft mask layer such as a photoresist layer, or can be a hard mask layer including a dielectric material or a metallic material. In case the mask layer 27 is a photoresist layer, the mask layer 27 can be patterned by lithographic exposure and development. In case the mask layer 27 is a hard mask layer, a photoresist layer can be applied over the mask layer 27 and can be lithographically patterned, and the pattern of the photoresist layer can be transferred into the mask layer 27 by an etch such as a reactive ion etch.

Holes can be formed in the mask layer 27 in the configuration of a plurality of lines of holes. Each hole can be an oblong hole that is elongated along the first direction (e.g., the x-direction), and each line of holes can extend along the first direction. Each line of holes can be laterally spaced from one another along the second direction (e.g., the y-direction). For example, a first line of holes can be formed in the mask layer 27 to expose portions of the underlying stack of layers such that the first line of holes extends in the first direction and each hole in the first line is elongated in the first direction. A second line of holes can be formed in the mask to expose portions of the underlying stack of layers concurrently with formation of the first line of holes. The second line of holes extends in the first direction, and is offset from the first line of holes in the second direction. Each hole in the second line of holes is elongated in the first direction. The photolithographic process employed to pattern the mask layer 27 can have a minimum feature size F. In one embodiment, process parameters for the lithographic process that patterns the photoresist layer can be selected such that the holes are laterally spaced by a distance of less than F in the first direction, and are laterally spaced by a distance greater than F in the second direction.

Subsequently, the pattern in the mask layer 27 can be transferred through the alternating stack (32L, 46L) by an anisotropic etch, which can be a reactive ion etch. The physically exposed portions of the alternating stack (32L, 46L) is etched to form holes in the stack of layers underlying the holes of the first and second lines and holes in the mask layer 27. The anisotropic etch can stop on the top surface of the electrically conductive patterned structures 20. An array of oblong trenches 29' are formed through the alternating stack (32L, 46L) of the electrically conductive layers 46L and the electrically insulating layers 32L. The sidewalls of the oblong trenches 29' can be substantially vertical, or can have a finite taper. Isolated oblong trenches 29' can be formed in linear arrays extending along the first direction and spaced from one another along the second direction.

Figure 14A:
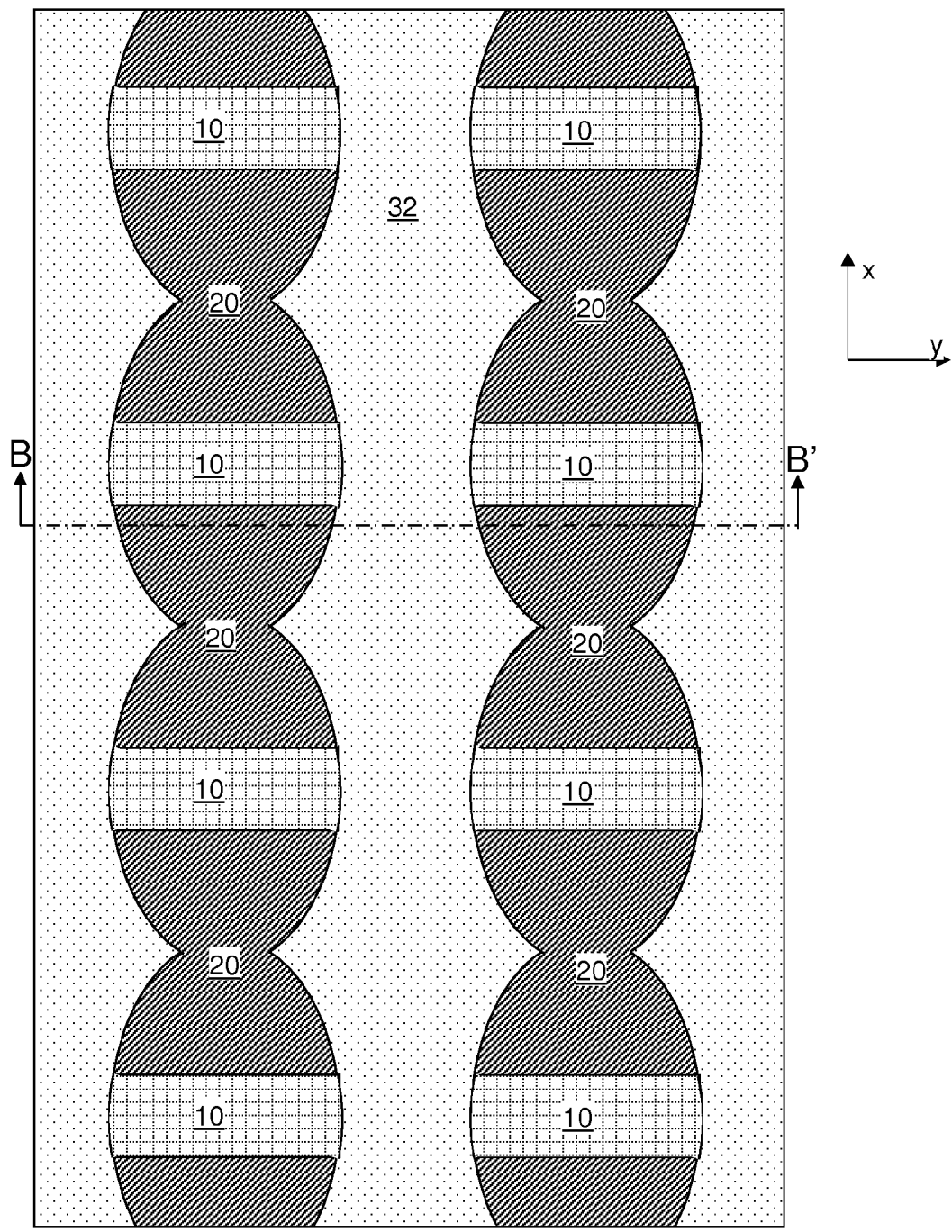
FIG. 14A is a top-down view of the second exemplary structure after modification of the pattern in the photoresist layer to form an array of openings having undulated widths according to the second embodiment of the present disclosure.
Figure 14B:
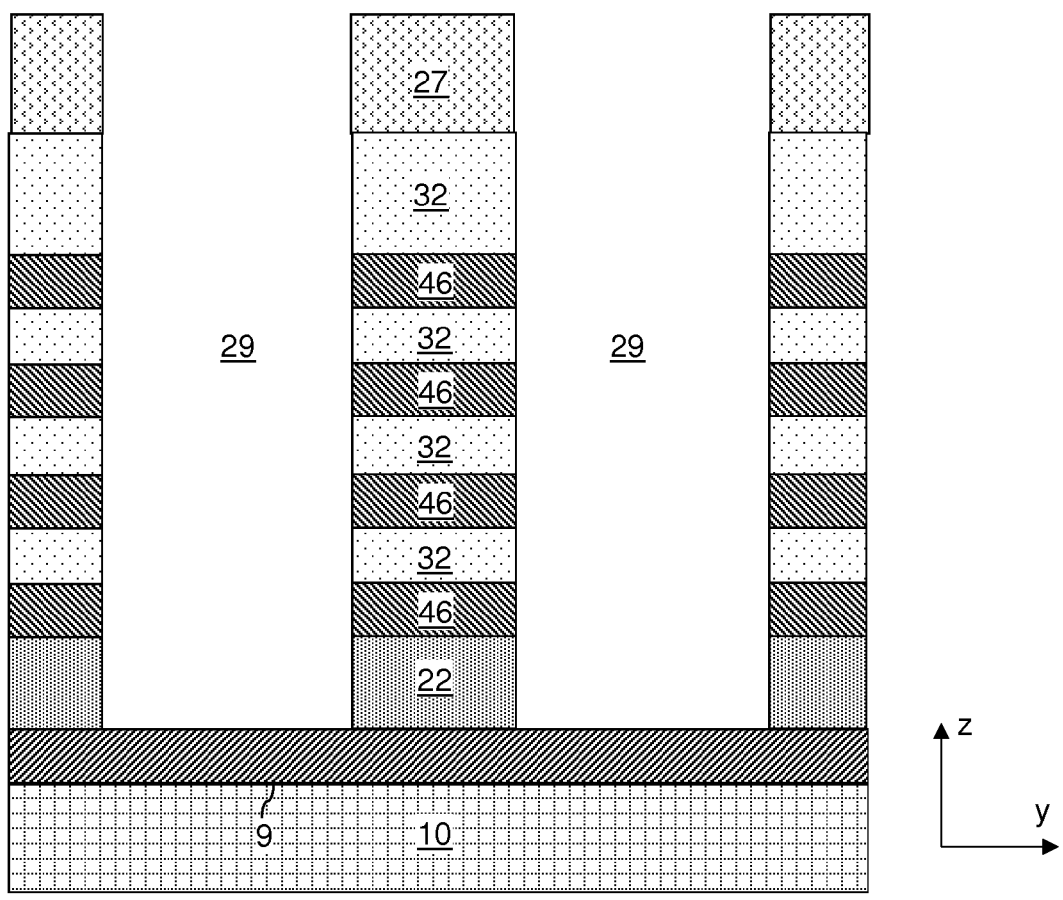
FIG. 14B is a vertical cross-sectional view of the second exemplary structure along the vertical plane B-B' of FIG. 14A.

Referring to FIGS. 14A and 14B, the oblong trenches 29' can be laterally expanded by an isotropic etch to form line trenches 29 including a plurality of expanded oblong trenches 29' that are merged along the first direction. The stack of layers in the alternating stack (32L, 46L) is further etched to widen the holes, i.e., the oblong trenches 29', in the stack of layers in the first and second directions to form at least a first chain of overlapping holes extending in the first direction defining a first trench, and a second chain of overlapping holes extending in the first direction defining a second trench. Each set of overlapping holes form a contiguous cavity laterally extending along the first direction, and is herein referred to as a line trench 29. Each line trench 29 is a contiguous opening having undulated widths. Each line trench 29 laterally extends along the first direction (i.e., the x-direction) and has an undulated width along the second direction (i.e., the y-direction).

Each line trench 29 is etched in, and through, the alternating plurality of electrically conductive layers 46L and electrically insulating lines 32L. Stacks of an alternating plurality of electrically conductive lines 46 elongated in the first direction (e.g., the x-direction) and electrically insulating lines 32 elongated in the first direction are formed from remaining portions of the alternating plurality of electrically conductive layers 46L and electrically insulating layers 32L. Each alternating stack of electrically conductive lines 46 and electrically insulating lines 32 is herein referred to as a line stack (32, 46). The electrically conductive lines 46 are elongated in the first direction, which is substantially parallel to the major surface 9 of the substrate 10. The electrically insulating lines 32 are elongated in the first direction. Each one of the plurality of electrically conductive lines 46 in a stack is electrically insulated from the other electrically conductive lines 46 in the same stack and in other stacks.

Figure 15A:
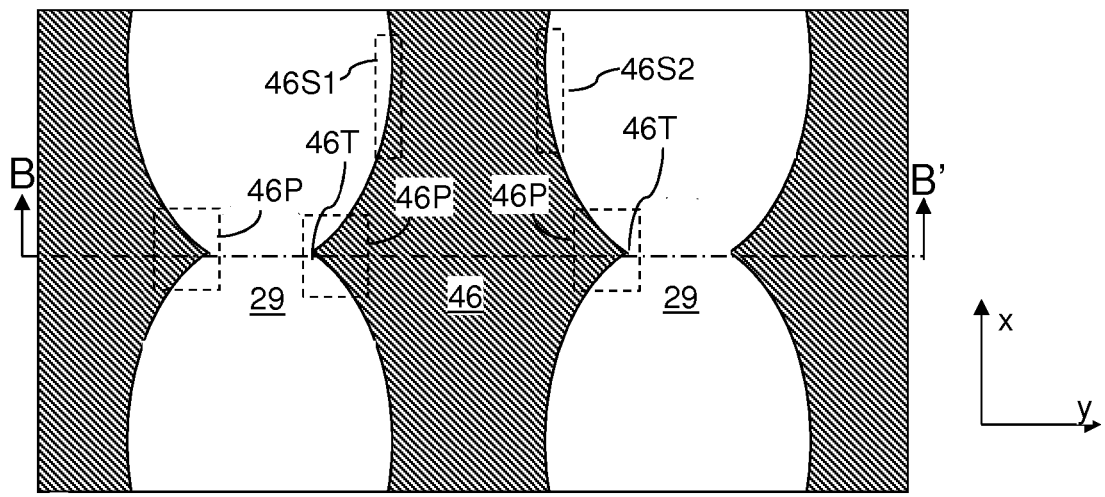
FIG. 15A is a horizontal cross-sectional view of the second exemplary structure after formation of line trenches and trench isolation structures having undulated widths along the horizontal plane A-A' of FIG. 15B according to the second embodiment of the present disclosure.
Figure 15B:
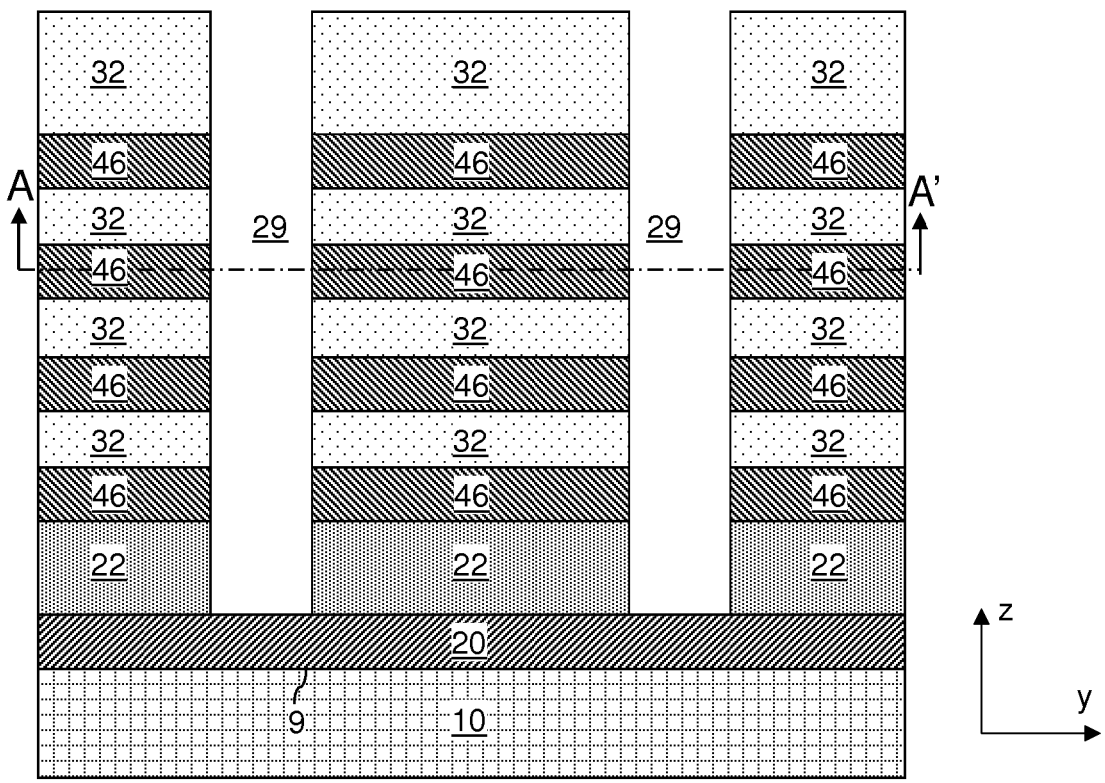
FIG. 15B is a vertical cross-sectional view of the second exemplary structure along the vertical plane B-B' of FIG. 15A.

Referring to FIGS. 15A and 15B, the mask layer 27 can be subsequently removed, for example, by ashing. A plurality of protrusions 46A is present on each electrically conductive line 46. Each protrusion 46B of an electrically conductive line 46 protrudes into the line trench 29. A remaining portion of the alternating stack (32L, 46L) between a pair of line trenches 29 constitutes a line stack (32, 46) including an alternating stack of electrically conductive lines 46 and electrically insulating lines 32. In one embodiment, the line trenches 29 can extend over a plurality of electrically conductive patterned structures 20. In one embodiment, the plurality of electrically conductive patterned structures 20 can extend along a first direction (e.g., the x-direction), which is the first horizontal direction, and the line trenches 29 can extend along the first direction. The line trenches 29 can have undulating widths along the first direction. In one embodiment, the line trenches 29 can have substantially vertical sidewalls. In another embodiment, the line trenches 29 can have tapered sidewalls such that each line trench 29 is wider at the top than at the bottom.

In one embodiment, each line trench 29 can have the same width at the bottom as at the top, and each stack can have substantially vertical sidewalls such that the bottom of the stack has the same width as the top of the stack. In another embodiment, each line trench 29 can be wider at the top than at the bottom, and each stack can be tapered such that the bottom of the stack is wider than the top of the stack.

Each line stack (32, 46) comprises an alternating plurality of electrically conductive lines 46 elongated in the first direction and electrically insulating lines 32 elongated in the first direction. Each line stack (32, 46) comprises a respective plurality of protrusions 46P on each electrically conductive line 46 therein. Each protrusion 46P of the plurality of protrusions 46P protrudes in the second direction from a sidewall (46S1, 46S2) of the electrically conductive line 46 to a distal tip 46T of the protrusion 46P.

Figure 16A:
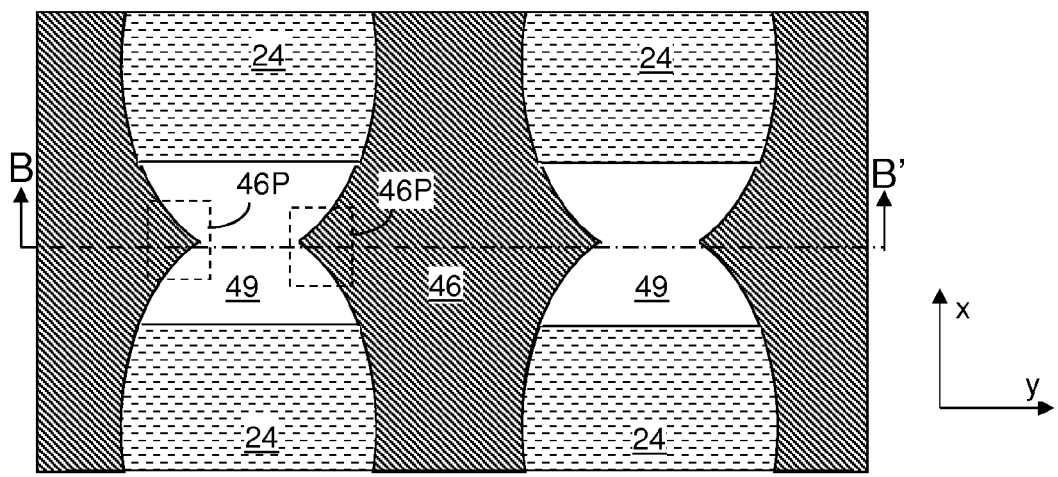
FIG. 16A is a horizontal cross-sectional view of the second exemplary structure after formation of memory openings along the horizontal plane A-A' of FIG. 16B according to the second embodiment of the present disclosure.
Figure 16B:
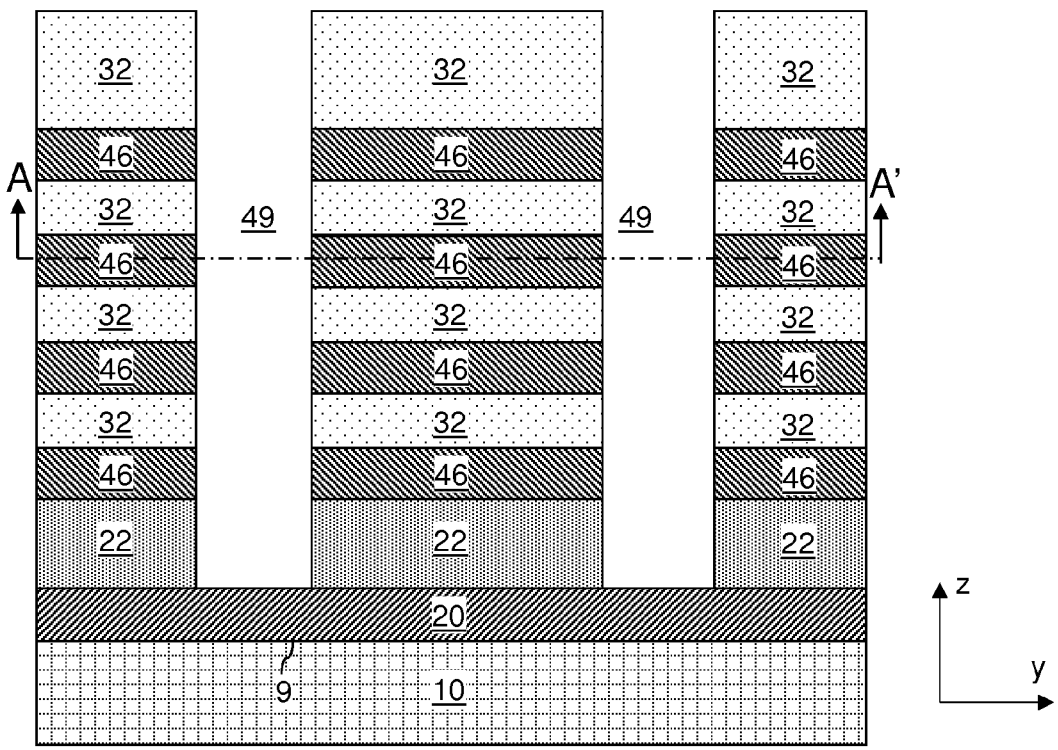
FIG. 16B is a vertical cross-sectional view of the second exemplary structure along the vertical plane B-B' of FIG. 16A.

Referring to FIGS. 16A and 16B, optionally, the processing steps of FIGS. 3A, 3B, 4A, 4B, 5A, and 5B are performed to form various trench isolation structures 24 that defines an array of a plurality of memory openings 49. The plurality of memory openings 49 can be in a two-dimensional rectangular array. In one embodiment, each of memory openings 49 can overlie an area of the electrically conducting patterned structures 20, and each trench isolation structure 24 can overlie a region between a neighboring pair of electrically conducting patterned structures 20. In one embodiment, the area of a memory opening 49 may be entirely within the area of one of the electrically conducting patterned structures 20.

Figure 17A:
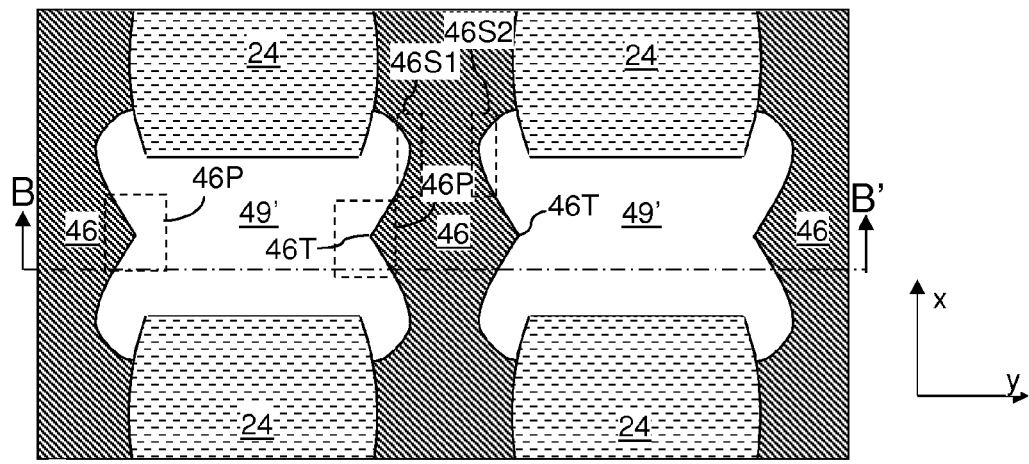
FIG. 17A is a horizontal cross-sectional view of the second exemplary structure after selective lateral expansion of memory openings along the horizontal plane A-A' of FIG. 17B according to the second embodiment of the present disclosure.
Figure 17B:
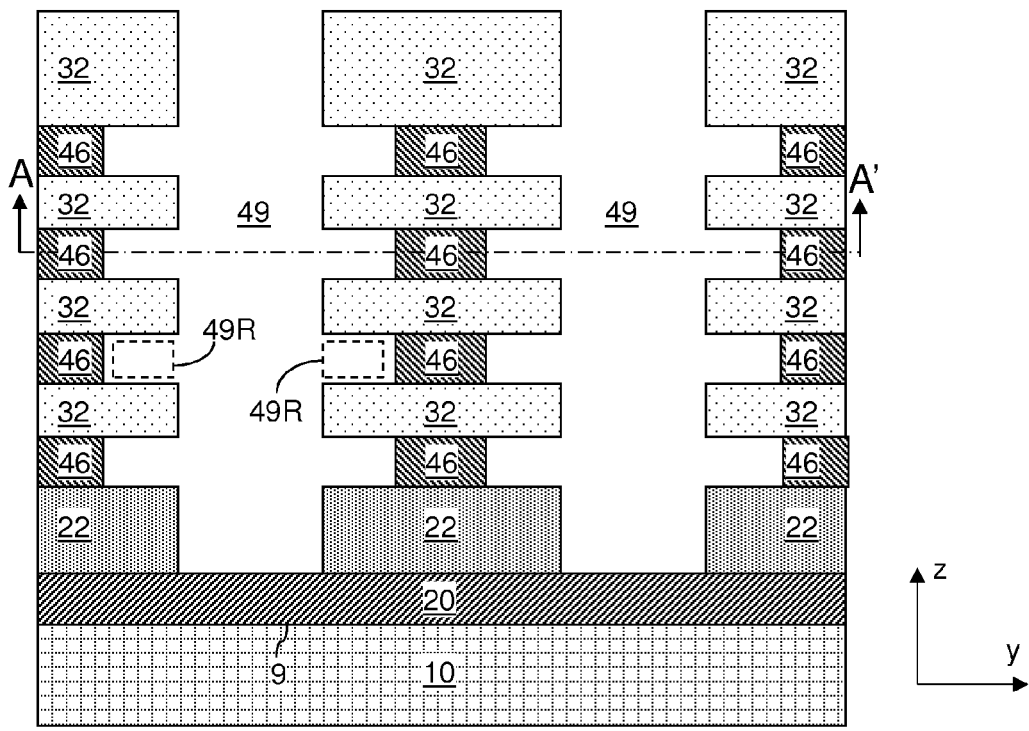
FIG. 17B is a vertical cross-sectional view of the second exemplary structure along the vertical plane B-B' of FIG. 17A.

Referring to FIGS. 17A and 17B, the processing steps of FIGS. 6A and 6B can be performed to selectively expand the memory openings 49 laterally. The plurality of electrically conductive lines 46 is selectively etched to form a plurality of recesses 49R in each line stack (32, 46). Each recess 49R of the plurality of recesses 49R is formed adjacent to a respective one of the plurality of electrically conductive lines 46, and is overhung by a respective one of the plurality of electrically insulating lines 32 in each line stack (32, 46). Each of the plurality of electrically conductive lines 46 can be recessed in the second direction (e.g., the y-direction) which is substantially perpendicular to the first direction (e.g., the x-direction) and is substantially parallel to the major surface 9 of the substrate 10.

In an illustrative example, a first plurality of electrically conductive lines 46 can be etched to form a first plurality of recesses in a first stack, i.e., a first line stack (32, 46), and a second plurality of electrically conductive lines 46 can be etched to form a second plurality of recesses in the second stack, i.e., a second line stack (32, 46), that is laterally spaced from the first line stack (32, 46) by at least one memory opening 49 contained within a line trench, within which a plurality of trench isolation structures 24 can be present. Each recess of the first plurality of recesses can be formed adjacent to a respective one of the plurality of electrically conductive lines 46, and can be overhung by a respective one of the plurality of electrically insulating lines 32 in each line stack (32, 46). Each recess of the second plurality of recesses can be formed adjacent to a respective one of the plurality of electrically conductive lines 46, and can be overhung by a respective one of the plurality of electrically insulating lines 32 in the second stack.

In one embodiment, a memory opening 49 can comprise a first sidewall comprising the first plurality of recesses 49R and a second sidewall comprising a second plurality of recesses 49R. Each of the protrusions 46P can be disposed substantially within a respective recess 49R of the plurality of recesses 49R. In one embodiment, each protrusion 46P of the first plurality of protrusions 46P can taper along the second direction from a wider end proximal to the first sidewall 46S1 of a first electrically conductive line 46 to a narrower end comprising the distal tip 46T of the protrusion 46P. Each distal tip 46T of at least one protrusion 46P can have a cusp shape.

In one embodiment, each line stack (32, 46) can comprise a respective first plurality of protrusions 46P on each of the plurality of electrically conductive lines 46, and a respective second plurality of protrusions 46P on each of the plurality of electrically conductive lines 46. Each protrusion 46P of the first plurality of protrusions 46P protrudes in the second direction from a first sidewall 46S of the plurality electrically conductive lines 46 to a distal tip 46T of the protrusion 46P, and each protrusion 46P of the second plurality of protrusions 46P protrudes in the second direction from a second sidewall 46S of the electrically conductive lines 46P to a distal tip 46T of the protrusion 46P. The first and second sidewalls 46S are on opposing sides of the electrically conductive lines 46, which are elongated along the first direction.

Figure 18A:
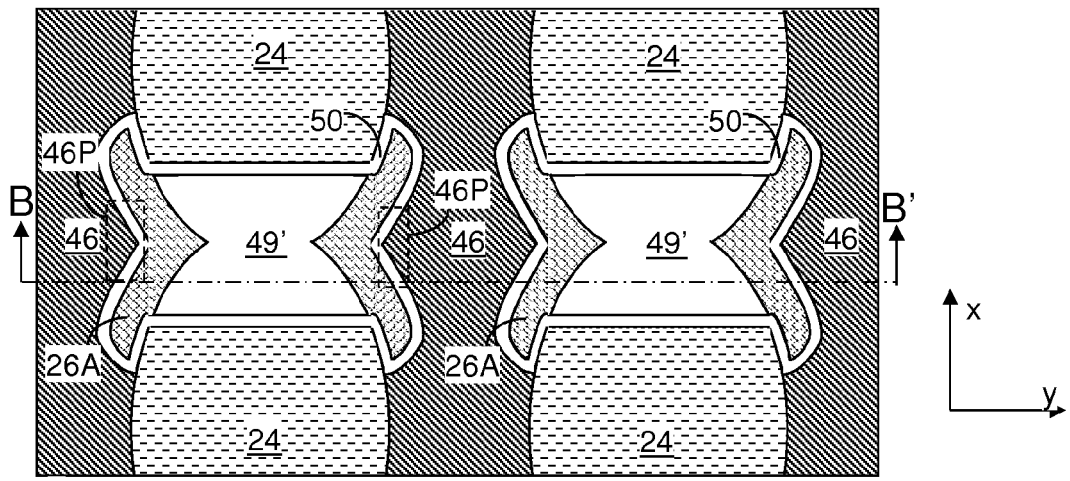
FIG. 18A is a horizontal cross-sectional view of the second exemplary structure after formation of read/write memory material layers and protective conductive material portions along the horizontal plane A-A' of FIG. 18B according to the first embodiment of the present disclosure.
Figure 18B:
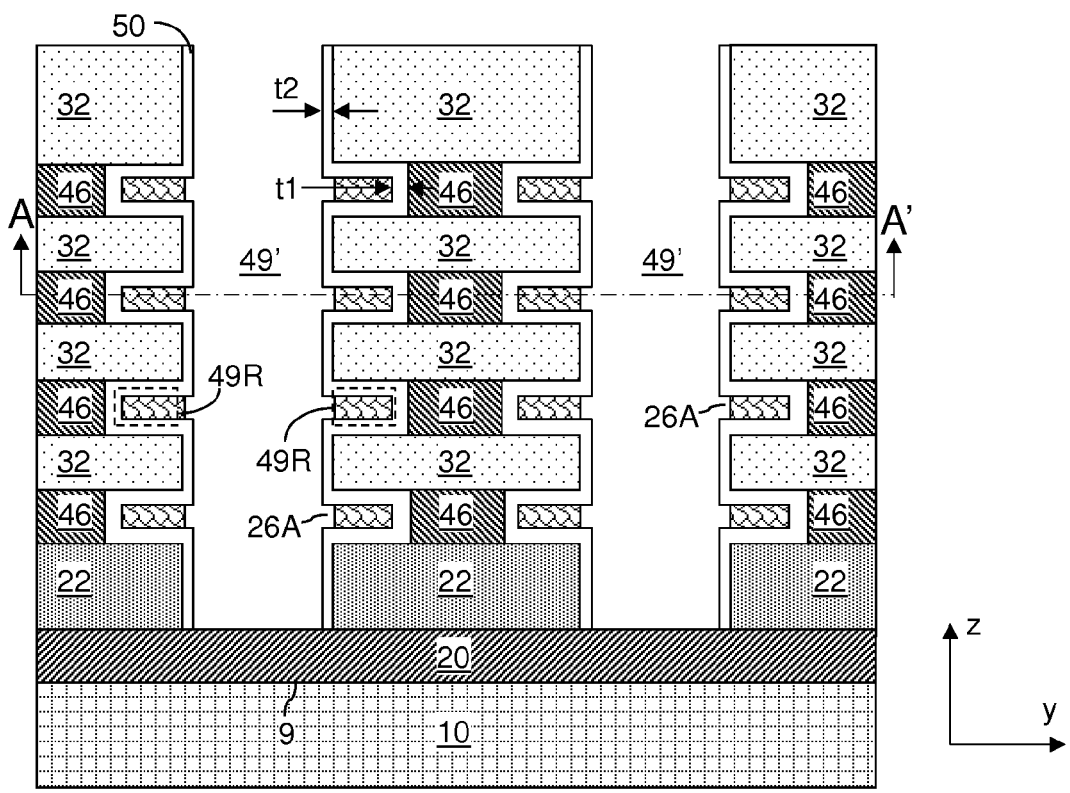
FIG. 18B is a vertical cross-sectional view of the second exemplary structure along the vertical plane B-B' of FIG. 18A.

Referring to FIGS. 18A and 18B, the processing steps of FIGS. 7A, 7B, 8A, 8B, 9A, and 9B are performed to form read/write memory material layers 50 and protective material portions 26A. In one embodiment, the read/write memory material of the read/write memory material layers 50 can be a non-volatile memory (NVM) material selected from a chalcogenide and a metal oxide material, and exhibits a stable, reversible shift in resistance in response to an external voltage applied to the material or to a current passed through the material.

Figure 19A:
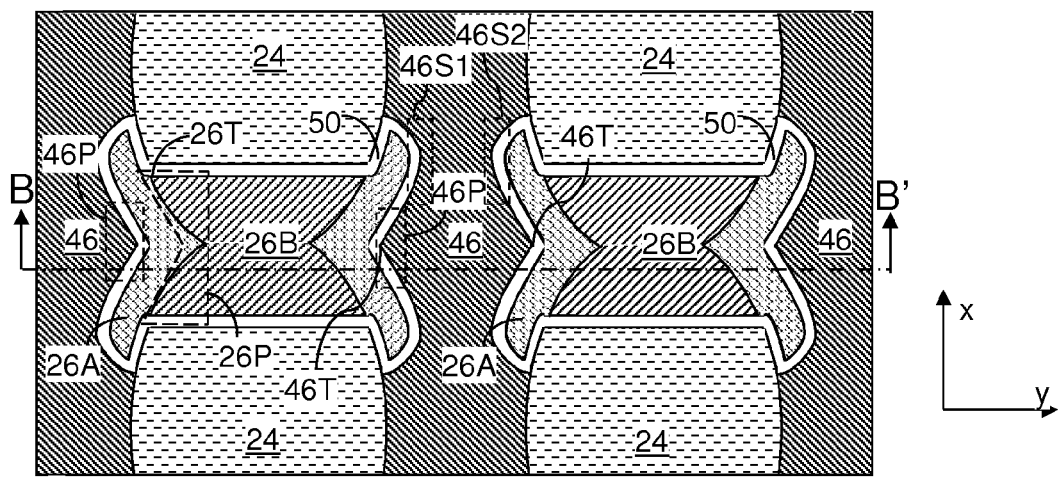
FIG. 19A is a horizontal cross-sectional view of the second exemplary structure after formation of electrically conductive bit lines along the horizontal plane A-A' of FIG. 19B according to the first embodiment of the present disclosure.
Figure 19B:
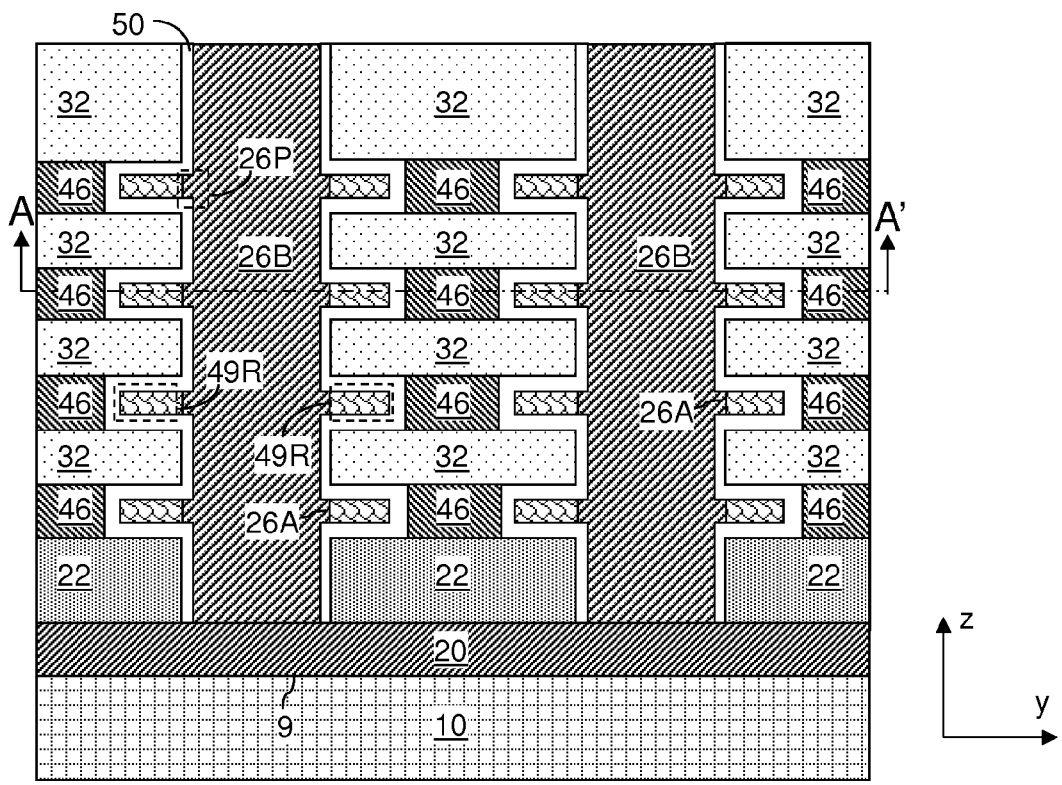
FIG. 19B is a vertical cross-sectional view of the second exemplary structure along the vertical plane B-B' of FIG. 19A.

Referring to FIGS. 19A and 19B, the processing steps of FIGS. 10A and 10B can be performed to form a plurality of electrically conductive bit lines 26B, which can be electrically conductive local bit lines that extend vertically (i.e., along the third direction), and connected to the electrically conductive global bit lines that extend horizontally (i.e., along the second direction).

In one embodiment, each electrically conductive bit line 26B can be in electrical contact with the read/write memory material of the read/write memory material layer 50. Each electrically conductive bit line 29B comprises an electrically conductive fill material filling the trench of a memory opening, and is in electrical contact with the layer of electrically conductive material at the trench floor, i.e., with the electrically conductive patterned structures 20. Each contact region between the electrically conductive fill material within an electrically conductive bit line 26B and the layer of electrically conductive material at the trench floor is substantially free of read/write memory material residue.

The exemplary structure includes a first stack comprising an alternating plurality of electrically conductive lines 46 elongated in a first direction (e.g., the x-direction) substantially parallel to the major surface 9 of the substrate 10 and electrically insulating lines 32 elongated in the first direction. Each of the first plurality of electrically conductive lines 46 is optionally recessed in a second direction (e.g., the y-direction) below an adjacent electrically insulating line 32 to form a first plurality of recesses 49R. The second direction can be substantially perpendicular to the first direction, and can be substantially parallel to the major surface 9 of the substrate 10. Each recess 49R of the first plurality of recesses 49R is formed adjacent to a respective one of the plurality of electrically conductive lines 46, and is overhung by a respective one of the plurality of electrically insulating lines 32 in the first stack. In one embodiment, the plurality of electrically conductive lines 46 in the first stack comprises a metal nitride, and the plurality of electrically insulating lines 32 in the first stack comprises an insulating oxide.

Each recess 49R in the plurality of recesses 49R corresponds to a respective memory cell in a memory device. The electrically conductive line 46 adjacent the recess 49R comprises, or is in electrical contact with, a word line for the memory cell. The read/write memory material can comprise a non-volatile memory (NVM) material, and the memory device can comprise a monolithic three dimensional non-volatile ReRAM memory device. For each recess 49R, the read/write memory material layer 50 can be conformal to, and partially fill, the recess 49R, thereby defining a notch in the read/write memory material.

The optional protective material of the protective material portions 26A can be a first electrically conductive material extending into the notch in the read/write memory material within each recess 49R, and in electrically contact with a second electrically conductive material of an electrically conductive bit line 26B. In one embodiment, an electrically conductive bit line 26B can be formed such that portions of the electrically conductive bit line 26B extend into the notches in the read/write memory material. Each electrically conductive line 46 of the plurality of electrically conductive lines 46 in the first stack is electrically insulated from the other electrically conductive lines 46 in the first stack.

The exemplary structure can further include a second stack comprising an alternating plurality of electrically conductive lines 46 elongated in the first direction and electrically insulating lines 32 elongated in the first direction. Each of the plurality of electrically conductive lines 46 is recessed in a second direction below an adjacent electrically insulating line 32 to form a second plurality of recesses. The read/write memory material of a portion of a read/write memory material layer 50 at least partially fills each of the second plurality of recesses 49R. A trench of the same memory opening as the memory opening on which the first stack is present can extend in the third direction. A first sidewall of the trench comprises the first plurality of recesses 49R at least partially filled with the read/write memory material, and a second sidewall of the trench comprises the second plurality of recesses 49R at least partially filled with the read/write memory material.

In one embodiment, the electrically conductive patterned structures 20 can be at least one electrically conductive global bit line extending in the second direction and in electrical contact with a first local bit line (e.g., a first electrically conductive bit line 26B), disposed in the first trench and a second local bit line (e.g., a second electrically conductive bit line 26B) disposed in the second trench that is laterally spaced from the first trench by at least one line stack (32, 46).

In one embodiment, at least one electrically conductive bit line 26B from the first and second plurality of electrically conductive bit lines 26B can comprise a plurality of bit line protrusions 26P. Each bit line protrusion 26P can protrude from a side of the bit line along the second direction to a distal bit line protrusion tip 26T in electrical contact with the read/write memory material. Each bit line protrusion 26P can be located in a respective memory cell.

In one embodiment, a first electrically conductive line 46 of the plurality of electrically conductive lines 46 comprises a first plurality of protrusions 46P, and each protrusion 46P of the first plurality of protrusions 46P can extend in the second direction from a first sidewall of the first electrically conductive line 46 to a distal tip 46T of the protrusion 46P that contacts read/write memory material of a respective one of the memory cells in the memory device.

Optionally, each protrusion 46P of the first plurality of protrusions 46P resides substantially within a respective recess 49R of the first plurality of recesses 49R. The respective recess 49R is adjacent to the first sidewall 46S1 of the first electrically conductive line 46. A second plurality of protrusions 46P can be present on the first electrically conductive line 46. Each protrusion 46P of the second plurality of protrusions 46P extends in the second direction from a second sidewall 46S2 of the first electrically conductive line 46 to a distal tip 46T of the protrusion 46P that contacts read/write memory material of another respective one of the memory cells in the memory device. The first and second sidewalls (46S1, 46S2) can be located on opposite sides of the first electrically conductive line, and can be elongated along the first direction.

In one embodiment, each protrusion of the first plurality of protrusions 46P tapers along the second direction from a wider end that is proximal to the first sidewall 46S1 of the first electrically conductive line 46 to a narrower end comprising the distal tip 46T of the protrusion 46. The distal tip 46T of the protrusion 46 can have a cusp shape, and can contact the read/write memory material of a respective one of the memory cells in the memory device along a line of contact extending in the third direction. Thus, each distal tip 46T can have a vertical edge that extends along the third direction, and a pair of concave surfaces in physical contact with a read/write memory material layer 50.

In one embodiment, a pair of concave sidewalls of an electrically conductive line 46 may be adjoined to each other at a vertical edge at a distal tip 46T of a protrusion 46P. In another embodiment, a pair of generally concave sidewalls of an electrically conductive line 46 may be adjoined to a convex sidewall that protrude along the second direction at a distal tip 46T of the protrusion 46. Each tip 46T can be defined by a monotonically increasing width within a horizontal cross-sectional shape as a function of a distance along the second direction from the most protruding point within the distal tip 46T. The second order derivative of the width of the protrusion 46P as a a function of a distance along the second direction from the most protruding point within the distal tip 46T may be zero, positive, or negative at various portions of the various portions of the protrusion 46P.

Each protrusion of the first plurality of protrusions 46P can reside substantially within a respective recess 49R of the first plurality of recesses 49R. The respective recess 49R is adjacent to the first sidewall of the first electrically conductive line 46. The first electrically conductive line 46 can comprises a second plurality of protrusions 46P. Each protrusion 46P of the second plurality of protrusions 46P extends in the second direction from a second sidewall 36S2 of the first electrically conductive line 46 to a distal tip 46T of the protrusion 46P that contacts read/write memory material of another respective one of the memory cells in the memory device. The first and second sidewalls are on opposite sides of the first electrically conductive line 46, and are elongated along the first direction.

Each of the electrically conductive lines in the at least one line stack (32, 46) can comprise, or can be in electrical contact with, a word line of the memory device. Each protrusion 46P is located in a respective memory cell of the memory device. The respective electrically conductive line 46 from which each protrusion 46P extends can comprise, or can be in electrical contact with, a word line for the memory cell.

In one embodiment, the memory device includes at least a first electrically conductive line 46 elongated in a first direction parallel to a major surface 9 of a substrate 10 and comprising a protrusion 46P protruding from a side wall (46S1, 46S2) of the first electrically conductive line 46 to a distal tip 46T in a second direction parallel to the major surface 9 of the substrate 10 and transverse to the first direction. The memory device further includes a second electrically conductive line such as an electrically conductive bit line 26B, which is elongated in a third direction perpendicular to the major surface 9 of the substrate 10. A read/write memory material is disposed between, and is in electrical contact with, the distal tip 46T of the protrusion 46P and the second electrically conductive line. The second electrically conductive line can comprises a bit line protrusion 26P that protrudes from a side of the bit line along the second direction to a distal bit line protrusion tip 26T in electrical contact with the read/write memory material.

Figure 20A:
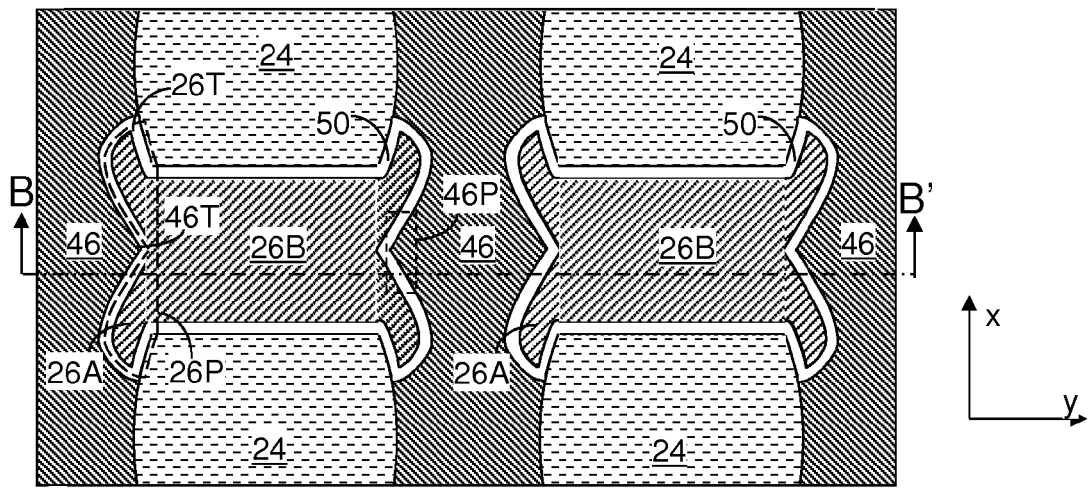
FIG. 20A is a horizontal cross-sectional view of a first alternative embodiment of the second exemplary structure along the horizontal plane A-A' of FIG. 20B according to the second embodiment of the present disclosure.
Figure 20B:
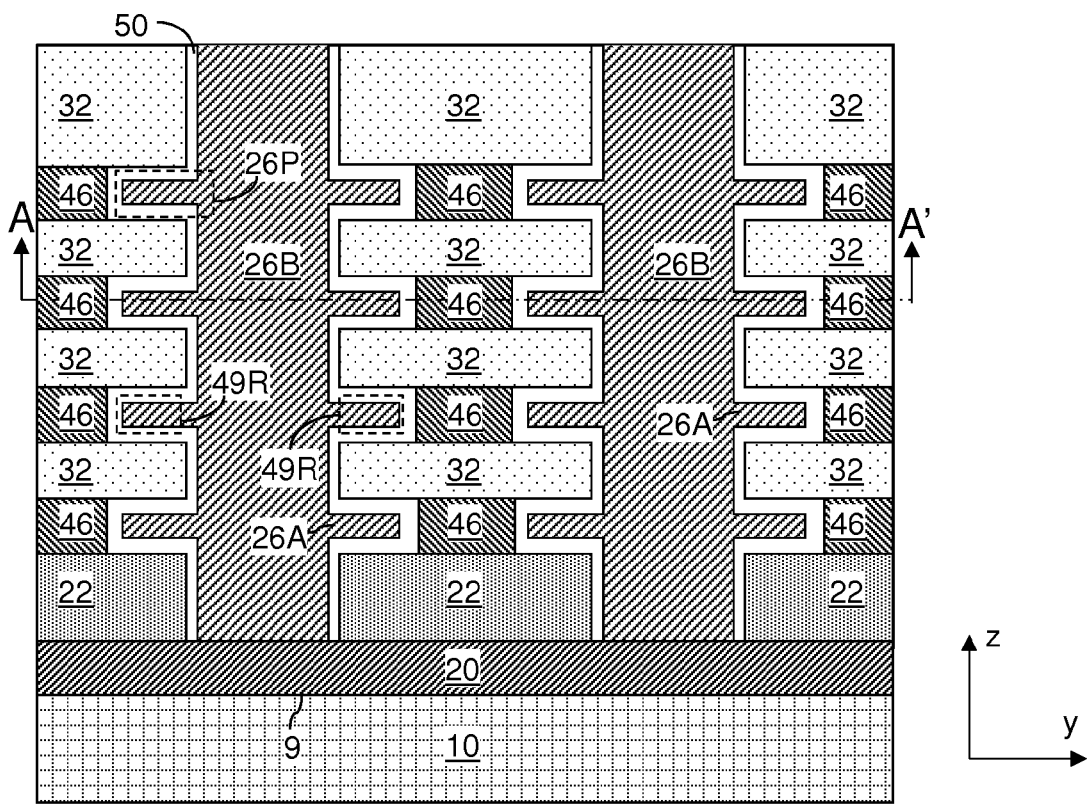
FIG. 20B is a vertical cross-sectional view of the first alternative embodiment of the second exemplary structure along the vertical plane B-B' of FIG. 20A.

Referring to FIGS. 20A and 20B, a first alternative embodiment of the second exemplary structure can be derived from the second exemplary structure by omitting formation of protective material portions 26A so that the electrically conductive bit lines 26B fill the notch within each recess 49B that is not filled with the read/write memory material layer 50. If the protective material portions 26A are not employed, the deposited conductive material can be present within portions of each recess 49R, and each electrically conductive bit line 26B can include laterally protruding portions that occupy the volumes recessed 49B.

Figure 21A:
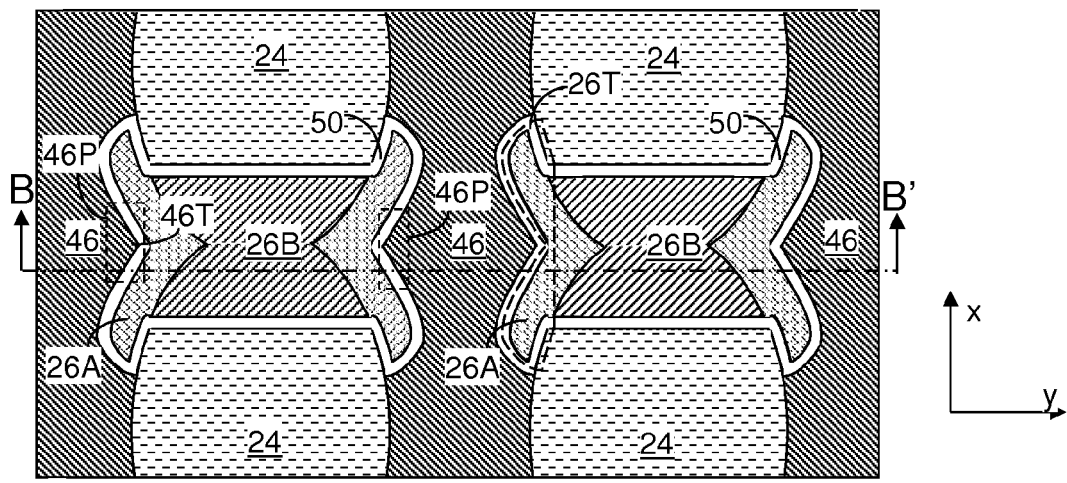
FIG. 21A is a horizontal cross-sectional view of a second alternative embodiment of the second exemplary structure along the horizontal plane A-A' of FIG. 21B according to the second embodiment of the present disclosure.
Figure 21B:
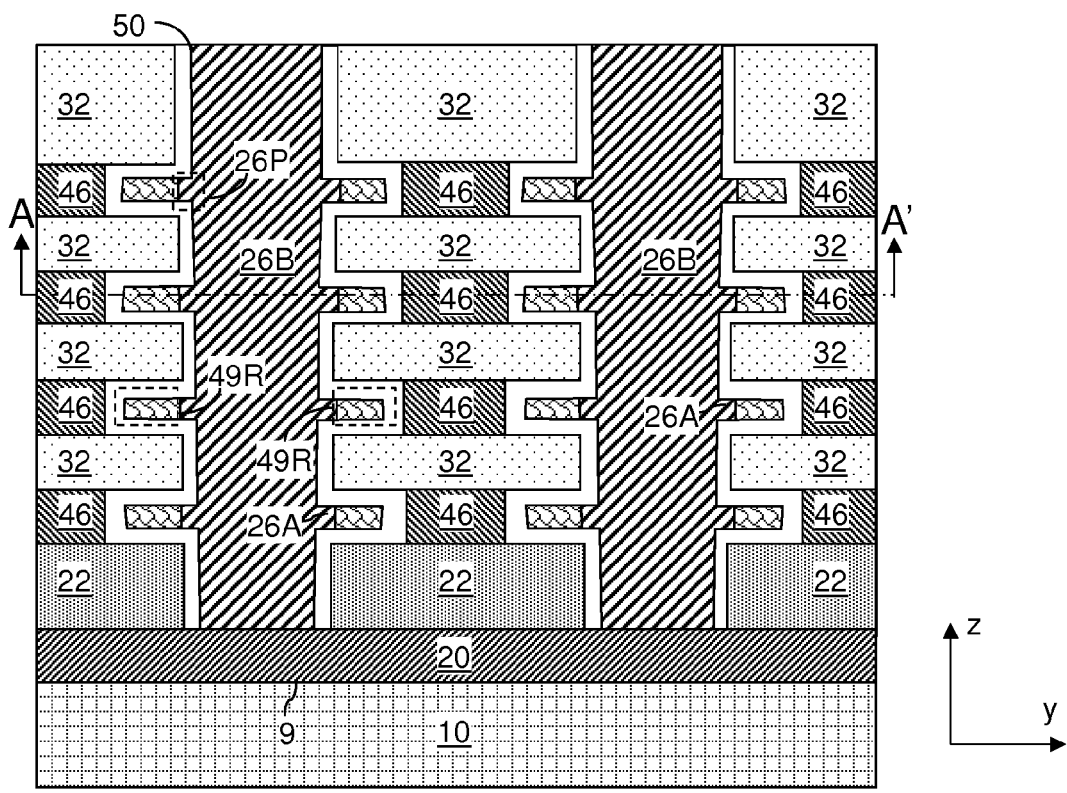
FIG. 21B is a vertical cross-sectional view of the second alternative embodiment of the second exemplary structure along the vertical plane B-B' of FIG. 21A.

Referring to FIGS. 21A and 21B, a second alternative embodiment of the second exemplary structure illustrates a configuration in which each trench including the trench isolation structures 24 and the memory openings are formed with a taper so that each memory opening and each trench isolation structure has a wider width at the top than at the bottom. In this case, within each line stack (32, 46), the bottommost electrically conductive line 46 can be wider than the topmost electrically conductive line 46, and the bottommost electrically insulating line 32 can be wider than the topmost electrically insulating line 32.

The presence of the distal tips 46P and/or the distal bit line protrusion tip 26T in the various exemplary structures of the present disclosure has the effect of providing pointy locations at which the strength of the electrical field applied across the read/write memory material is locally maximized. The increase in the magnitude of the electrical field around the distal tips 46P and/or the distal bit line protrusion tip 26T is conducive to generation and/or removal of the filaments within the read/write memory material or other mechanisms for programming and/or erasing the memory cell through changes in the read/write memory material induced by the electrical field applied across the read/write memory material layers 50. Thus, the presence of the distal tips 46T and/or the distal bit line protrusion tip 26T is believed to lower the operational voltage, and/or enhanced the performance, of the memory devices of the present disclosure.

Figure 22A:
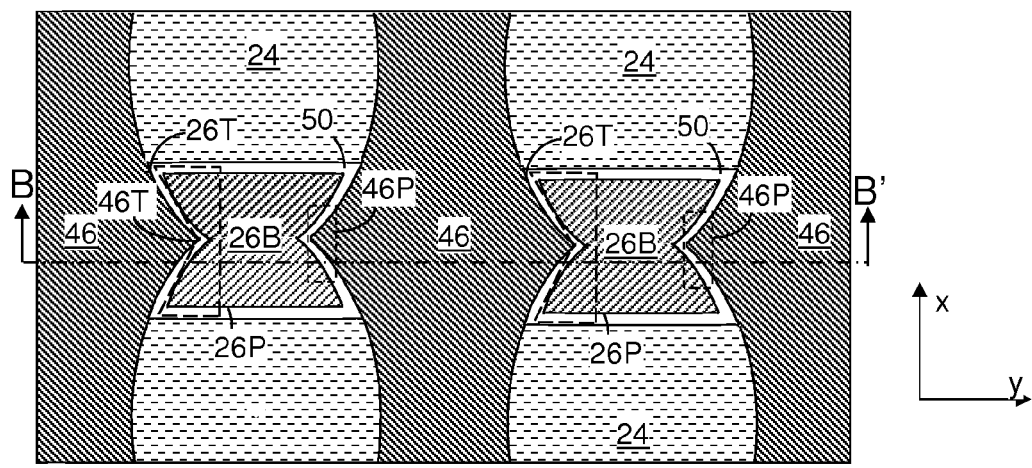
FIG. 22A is a horizontal cross-sectional view of a third alternative embodiment of the second exemplary structure along the horizontal plane A-A' of FIG. 21B according to the second embodiment of the present disclosure.
Figure 22B:
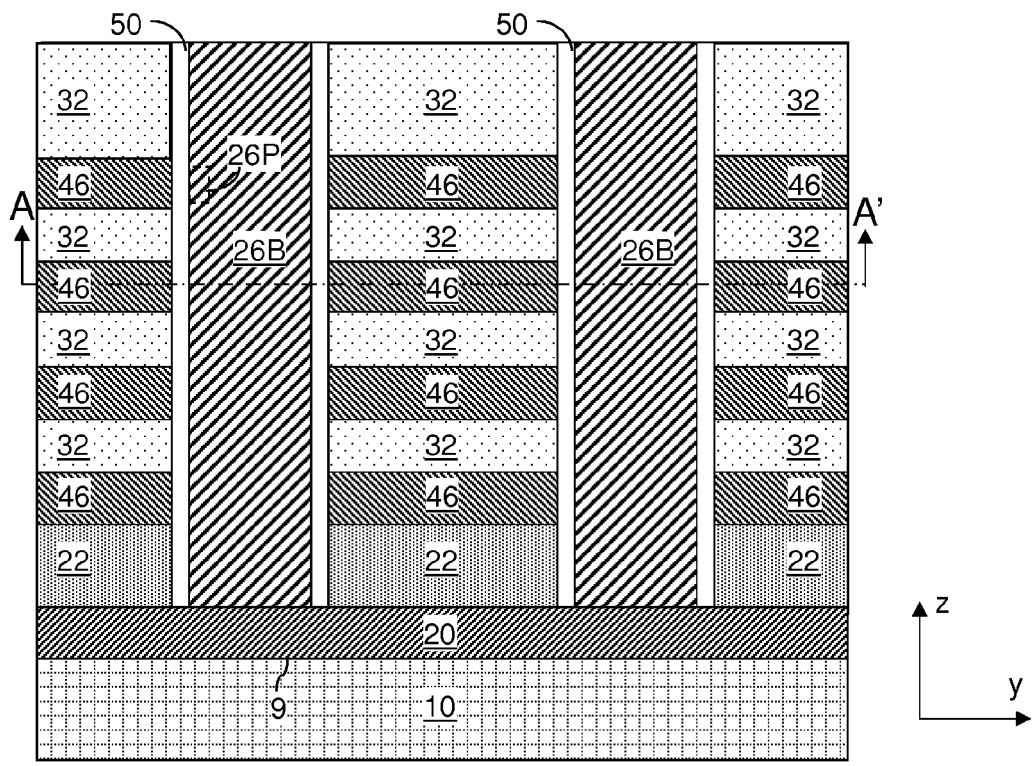
FIG. 22B is a vertical cross-sectional view of the third alternative embodiment of the second exemplary structure along the vertical plane B-B' of FIG. 21A.

Referring to FIGS. 22A and 22B, a third alternative embodiment of the second exemplary structure is shown, which can be derived from the second exemplary structure by omission of the lateral recess process illustrated in FIGS. 6A and 6B. In this case, the electrically conductive lines 46 are not laterally recesses, and each vertically adjoining pair of an electrically insulating line 32 and an electrically conductive line 32 can have substantially the same horizontal cross-sectional shape.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:
   providing a stack of layers comprising an alternating plurality of electrically conductive layers and electrically insulating layers, each layer in the stack of layers extending in a first direction substantially parallel to a major surface of a substrate and in a second direction substantially parallel to the major surface of the substrate and transverse to the first dimension and having a thickness in a third direction substantially perpendicular to the major surface of a substrate; and
   patterning the stack of layers to form at least one line stack, the at least one line stack comprising:
      an alternating plurality of electrically conductive lines elongated in the first direction and electrically insulating lines elongated in the first direction; and
      a respective first plurality of protrusions on each electrically conductive line of the plurality of electrically conductive lines, wherein each protrusion of the first plurality of protrusions protrudes in the second direction from a first sidewall of the electrically conductive line to a distal tip of the protrusion.

2. The method of claim 1, wherein the at least one line stack further comprises:
   a respective second plurality of protrusions on each of the plurality of electrically conductive lines,
   wherein each protrusion of the second plurality of protrusions protrudes in the second direction from a second sidewall of the first electrically conductive line to a distal tip of the protrusion, and
   wherein the first and second sidewalls are on opposing sides of the first electrically conductive lines which are elongated along the first direction.

3. The method of claim 2, wherein patterning the stack of layers to form at least one line stack comprises:
   forming a mask layer on the stack of layers; and
   forming a first line of holes in the mask layer to expose portions of the underlying stack of layers, the first line of holes extending in the first direction, wherein each hole in the first line is elongated in the first direction.

4. The method of claim 3, wherein patterning the stack of layers to form at least one line stack further comprises:
   forming a second line of holes in the mask to expose portions of the underlying stack of layers, the second line of holes extending in the first direction and offset from the first line of holes in the second direction, wherein each hole in the second line of holes is elongated in the first direction.

5. The method of claim 4, wherein patterning the stack of layers to form at least one line stack further comprises:
   etching exposed portions of the stack of layers to form holes in the stack of layers underlying the holes of the first and second lines and holes in the mask layer.

6. The method of claim 5, wherein patterning the stack of layers to form at least one line stack further comprises further etching the stack of layers to widen the holes in the stack of layers in the first and second directions to form:
   a first chain of overlapping holes extending in the first direction defining a first trench, and wherein the respective first plurality of protrusions on each electrically conductive line of the plurality of electrically conductive lines protrude into the first trench; and
   a second chain of overlapping holes extending in the first direction defining a second trench, and wherein the respective second plurality of protrusions on each electrically conductive line of the plurality of electrically conductive lines protrude into the second trench.

7. The method of claim 6, wherein forming the first and second lines of holes in the mask layer comprises:
   performing photolithographic process having a minimum feature size F, wherein the holes are laterally spaced by a distance of less than F in the first direction, and are laterally spaced by a distance greater than F in the second direction.

8. The method of claim 6, wherein each of the electrically conductive lines in the at least one line stack comprise or are in electrical contact with a word line of the memory device, and further comprising:
   forming a plurality of electrically conductive local bit lines elongated in the third direction in each of the first and second trenches.

9. The method of claim 8, further comprising:
   depositing a read/write memory material in each of the first and second trenches such that, for each protrusion of the first and second pluralities of protrusions, wherein a portion of the read/write memory material is disposed between and in electrical contact with the protrusion and a respective one of the plurality of electrically conductive local bit lines.

10. The method of claim 9, wherein each protrusion is located in a respective memory cell of the memory device.

11. The method of claim 10, wherein:
    at least one electrically conductive local bit line from the first and second plurality of electrically conductive local bit lines comprises a plurality of bit line protrusions;
    each bit line protrusion protrudes from a side of the bit line along the second direction to a distal bit line protrusion tip in electrical contact with the read/write memory material; and
    each bit line protrusion is located in a respective memory cell of the memory device.

12. The method of claim 10, further comprising:
    forming at least one electrically conductive global bit line extending in the second direction and in electrical contact with a first local bit line disposed in the first trench and a second local bit line disposed in the second trench.

13. The method of claim 12, wherein the read/write memory material comprises a non-volatile memory (NVM) material and wherein the memory device comprises a monolithic three dimensional non-volatile ReRAM memory device.

14. The method of claim 13, wherein:
the NVM material is selected from a chalcogenide and a metal oxide material, and exhibits a stable, reversible shift in resistance in response to an external voltage applied to the material or to a current passed through the material; and
the substrate comprises a silicon substrate having at least one driver circuit for the memory device located thereon or therein.

15. The method of claim 10, wherein each electrically conductive line of the plurality of electrically conductive lines in the at least one line stack is electrically insulated from the other electrically conductive lines in the same line stack.

16. The method of claim 10, wherein each protrusion of the first plurality of protrusions tapers along the second direction from a wider end proximal to the first sidewall of the first electrically conductive line to a narrower end comprising the distal tip of the protrusion.

17. The method of claim 15, wherein the distal tip of each protrusion has a cusp shape and contacts the read/write memory material of a respective one of the plurality of memory cells in the memory device along a line extending in the third direction.

18. The method of claim 7, further comprising:
selectively etching the alternating plurality of electrically conductive lines in the at least one line stack such that each of the electrically conductive lines is overhung by a respective overlaying insulating line from the plurality of insulating lines to form a plurality or recesses in at least one sidewall of at least the first trench;
wherein each of the protrusion of the first plurality of protrusions is disposed substantially within a respective recess of the plurality of recesses.

19. A memory device, comprising:
a substrate having a major surface;
a line stack comprising an alternating plurality of electrically conductive lines elongated in a first direction substantially parallel to the major surface of the substrate and electrically insulating lines elongated in the first direction;
a first trench extending in the first direction along a first side of the line stack facing a second direction transverse the first direction;
a read/write memory material at least partially filling the first trench;
a first plurality of electrically conductive bit lines elongated in a third direction substantially perpendicular to the major surface of the substrate, wherein each electrically conductive bit line is at least partially contained in the first trench, and each electrically conductive bit line is in electrical contact with the read/write memory material; and
a respective first plurality of protrusions on each electrically conductive line of line stack, wherein each protrusion of the respective first plurality of protrusions protrudes into the first trench from a first sidewall of the electrically conductive line to a distal tip in contact with the read/write memory material.

20. The memory device of claim 19, further comprising:
a second trench extending in the first direction along a second side of the line stack opposite the first side of the line stack and at least partially filed with the read/write memory material;
a second plurality of electrically conductive bit lines elongated in a third direction and at least partially contained in the second trench, wherein each of the second plurality of electrically conductive bit lines is in electrical contact with the read/write memory material in the second trench; and
a respective second plurality of protrusions on each electrically conductive line of line stack, wherein each protrusion of the second plurality of protrusions protrudes into the second trench from a second sidewall of the electrically conductive line to a distal tip in contact with the read/write memory material in the second trench.

21. The memory device of claim 20, wherein:
each protrusion of the first and second pluralities of protrusions is located in a respective memory cell in the memory device, and
the respective electrically conductive line from which each protrusion extends comprises or is in electrical contact with a word line for the memory cell.

22. The memory device of claim 21, wherein:
at least one electrically conductive bit line from the first and second plurality of electrically conductive bit lines comprises a plurality of bit line protrusions;
each bit line protrusion protrudes from a side of the bit line along the second direction to a distal bit line protrusion tip in electrical contact with the read/write memory material; and
each bit line protrusion is located in a respective memory cell.

23. The memory device of claim 22, wherein the read/write memory material comprises a non-volatile memory (NVM) material and wherein the memory device comprises a monolithic three dimensional non-volatile ReRAM memory device.

24. The memory device of claim 23, wherein:
the NVM material is selected from a chalcogenide and a metal oxide material, and exhibits a stable, reversible shift in resistance in response to an external voltage applied to the material or to a current passed through the material; and
the substrate comprises a silicon substrate having at least one driver circuit for the memory device located thereon or therein.

25. The memory device of claim 21, wherein each one of the plurality of electrically conductive lines in the line stack is electrically insulated from the other electrically conductive lines in the line stack.

26. The memory device of claim 21, wherein each protrusion of the first plurality of protrusions tapers along the second direction from a wider end proximal to the first sidewall of the first electrically conductive line to a narrower end comprising the distal tip of the protrusion.

27. The memory device of claim 26, wherein the distal tip of at least one protrusion has a cusp shape and contacts the read/write memory material of a respective one of the plurality of the memory cells in the memory device along a line extending in the third direction.

28. A memory device comprising:
a first electrically conductive line elongated in a first direction parallel to a major surface of a substrate and comprising a protrusion protruding from a side wall of the first electrically conductive line to a distal tip in a second direction parallel to the major surface of a substrate and transverse to the first direction;
a second electrically conductive line elongated in a third direction perpendicular to the major surface of the substrate; and a read/write memory material disposed between and in electrical contact with the distal tip of the protrusion and the second electrically conductive line.

29. The memory device of claim 28, wherein the protrusion tapers along the second direction from a wider end proximal to the sidewall of the first electrically conductive line to a narrower end comprising the distal tip of the protrusion.

30. The memory device of claim 29, wherein the distal tip of the protrusion has a cusp shape and contacts the read/write memory material along a line extending in the third direction.

31. The memory device of claim 30, comprising at least one insulating layer that overhangs the first electrically conductive line in the second direction to form a recess at least partially containing the protrusion.

32. The memory device of claim 31, wherein the second electrically conductive line comprises a bit line protrusion that protrudes from a side of the bit line along the second direction to a distal bit line protrusion tip in electrical contact with the read/write memory material.

33. The memory device of claim 27, wherein:
the first electrically conductive line comprises or is in electrical contact with a word line for a memory cell;
the second electrically conductive line comprises or is in electrical contact with a bit line for the memory cell.

34. The memory device of claim 33, wherein the read/write memory material comprises a non-volatile memory (NVM) material and wherein the memory device comprises a monolithic three dimensional non-volatile ReRAM memory device.

35. The memory device of claim 34, wherein:
the NVM material is selected from a chalcogenide and a metal oxide material, and exhibits a stable, reversible shift in resistance in response to an external voltage applied to the material or to a current passed through the material; and
the substrate comprises a silicon substrate having at least one driver circuit for the memory device located thereon or therein.

* * * * *